(12) United States Patent
Sinangil et al.

(10) Patent No.: US 9,245,601 B2
(45) Date of Patent: Jan. 26, 2016

(54) HIGH-DENSITY LATCH ARRAYS

(71) Applicant: NVIDIA Corporation, Santa Clara, CA (US)

(72) Inventors: Mahmut Ersin Sinangil, Medford, MA (US); John W. Poulton, Chapel Hill, NC (US); Brucek Kurdo Khailany, Austin, TX (US); John H. Edmondson, Arlington, MA (US)

(73) Assignee: NVIDIA Corporation, Santa Clara, CA (US)

( * ) Notice: Subject to any disclaimer, the term of this patent is extended or adjusted under 35 U.S.C. 154(b) by 0 days.

(21) Appl. No.: 14/296,320

(22) Filed: Jun. 4, 2014

(65) Prior Publication Data
US 2015/0357009 A1 Dec. 10, 2015

(51) Int. Cl.
*G11C 8/16* (2006.01)
*G11C 7/10* (2006.01)
*G11C 8/08* (2006.01)

(52) U.S. Cl.
CPC . *G11C 7/106* (2013.01); *G11C 8/08* (2013.01)

(58) Field of Classification Search
CPC .................................... G11C 8/16; G11C 8/08
USPC .............................................. 365/156, 230.06
See application file for complete search history.

(56) References Cited

U.S. PATENT DOCUMENTS

| 7,889,576 | B2* | 2/2011 | Sasaki ...................... 365/189.16 |
| 8,665,637 | B2* | 3/2014 | Ishikura et al. ............... 365/154 |
| 8,837,205 | B2* | 9/2014 | Pelley et al. ................. 365/154 |
| 8,947,968 | B2* | 2/2015 | Chen et al. ................... 365/227 |

* cited by examiner

*Primary Examiner* — Michael Tran
(74) *Attorney, Agent, or Firm* — Zilka-Kotab, PC

(57) ABSTRACT

A system and device are provided for implementing memory arrays using high-density latch cells. The device includes an array of cells arranged into columns and rows. Each cell comprises a latch cell that includes a transmission gate, a pair of inverters, and an output buffer. Each row of latch cells is connected to at least one common node for addressing the row of latch cells, and each column of latch cells is connected to a particular bit of an input signal and a particular bit of an output signal. A register file may be implemented using one or more arrays of the high-density latch cells to replace any or all of the banks of SRAM cells typically used to implement the register file.

18 Claims, 17 Drawing Sheets

HIGH-DENSITY LATCH ARRAYS

This invention was made with Government support under LLNS subcontract B599861 awarded by DOE, and with Government support under Agreement HR0011-13-3-0001 awarded by DARPA. The Government has certain rights in this invention.

FIELD OF THE INVENTION

The present invention relates to semiconductor memory structures, and more particularly to alternatives for conventional static random access memory (SRAM) cells.

BACKGROUND

SRAM cells provide a high-density and fast on-chip storage solution that may be implemented in many of today's integrated circuits (ICs). A conventional six transistor (6T) SRAM cell is a bi-stable latching circuit that relies on the relative strength of each of the transistors in the cell for storing a bit of data. FIG. 1 illustrates a standard 6T SRAM cell 100, in accordance with the prior art. It will be appreciated that the SRAM cell illustrated in FIG. 1 is only one type of SRAM cell and that other types (e.g., 4T, 8T, 10T) exist as well. As shown in FIG. 1, the SRAM cell 100 includes six MOSFET (Metal Oxide Semiconductor Field Effect Transistors). The SRAM cell 100 has four main MOSFETs, two p-type MOSFETs (PMOS) (i.e., 111 and 112) and two n-type MOSFETs (NMOS) (i.e., 113 and 114), that form two cross-coupled inverters (i.e., the input of the first inverter is connected to the output of the second inverter and the input of the second inverter is connected to the output of the first inverter). The first inverter comprises PMOS 111 and NMOS 113 having the drain terminals coupled to a common node and the gate terminals coupled to another common node. The second inverter comprises PMOS 112 and NMOS 114 having the drain terminals coupled to a common node and the gate terminals coupled to another common node. Then the drain terminals of each inverter are coupled to the gate terminals of the other inverter. The source terminals of PMOS 111 and PMOS 112 are coupled to a supply voltage (VDD) and the source terminals of NMOS 113 and NMOS 114 are coupled to a ground potential. The cross-coupled inverters are stable in one of two states that represent a logic-high and a logic-low.

The SRAM cell 100 may be accessed using the word line (WL) signal to turn on the access MOSFETS (i.e., NMOS 115 and NMOS 116). In order to read the SRAM cell 100, the bit lines (i.e., the BL signal and the complement of the BL signal) are pre-charged to a logic-high value and then the WL signal is asserted on the word line. The cross-coupled inverters charge or drain each of the bit lines, which are then compared by a sensing amplifier (not shown) to determine the state of the SRAM cell 100. In order to write the SRAM cell 100, the value to be written to the SRAM cell 100 is applied to the bit lines and then the WL signal is asserted on the word line. The bit line drivers are much stronger than the MOSFETs of the cross-coupled inverters so the signals on the bit lines override the current state of the cross-coupled inverters to latch in the new value of the SRAM cell 100.

One of skill in the art would recognize that the proper operation of the SRAM cell 100 relies on the relative strength of the components of the device as well as the drivers of the signals applied to the bit lines and word line. For example, as already mentioned, the drivers for the bit lines must be sized to overcome the feedback from the cross-coupled inverters. In addition, during a read operation, the voltage disturbance on the internal nodes resulting from the voltage divider comprising the access MOSFETs and a corresponding MOSFET in the cross-coupled inverters should be small enough not to disturb the state of the cell. However, in sub-micron technologies, individual transistors may exhibit large variations in operating characteristics due to manufacturing conditions. In other words, the relative strengths of devices on the IC may be skewed, which may cause the SRAM cell 100 to not operate properly. Furthermore, it is becoming increasingly more difficult to design critical circuits such as sense-amplifiers in deeply scaled CMOS fabrication processes, where device sizes are digitized and longer channel lengths are not available. Various techniques are used to compensate for these shortcomings.

SRAM cells may be operated at a nominal supply voltage, even when surrounding logic is scaled to a lower supply voltage. However, this approach may require two separate voltage rails, which not only requires a more complicated power grid on the IC to ensure reliable power delivery, but also introduces additional complexity when the signals cross different voltage domains within the IC. Redundancy and error-correction codes (ECC) may be used to detect and repair erroneous bits when SRAM cells fail. However, redundancy techniques increase the number of cells required to store a fixed amount of data and can also increase costs during testing or add latency to memory access operations. Peripheral assist circuits can be utilized to alter internal voltages in the SRAM cells during memory access operations, but again, this technique adds additional complexity and increases the energy consumption of the memory array. Finally, larger device sizes and/or larger timing margins may be used in the design of critical circuits to ensure correct operation, but this solution is not an efficient use of die space. Thus, there is a need for addressing these issues and/or other issues associated with the prior art.

SUMMARY

A system and device are provided for implementing memory arrays using high-density latch cells. The device includes an array of cells arranged into columns and rows. Each cell comprises a latch cell that includes a transmission gate, a pair of inverters, and an output buffer. Each row of latch cells is connected to at least one common node for addressing the row of latch cells, and each column of latch cells is connected to a particular bit of an input signal and a particular bit of an output signal. A register file may be implemented using one or more arrays of the high-density latch cells to replace any or all of the banks of SRAM cells typically used to implement the register file.

DETAILED DESCRIPTION

High-density latch arrays may provide an alternative to arrays of SRAM cells used as memory for integrated circuits. The high-density latch cell, although not as small as a standard SRAM cell, may be implemented with a significantly smaller footprint than a standard latch cell that enables a storage capacity of an array of high-density latch cells to be comparable to an array of SRAM cells. A latch cell does not have the same kind of access issues associated with SRAM cells because the latch cell does not rely on the relative strengths of the various devices in the latch cell. When a value is written to a latch cell, an internal node is kept floating to allow the new data to be written to the latch cell. In addition, a read buffer eliminates read disturbances by decoupling the internal node in the latch from the external output node.

Figure 1:
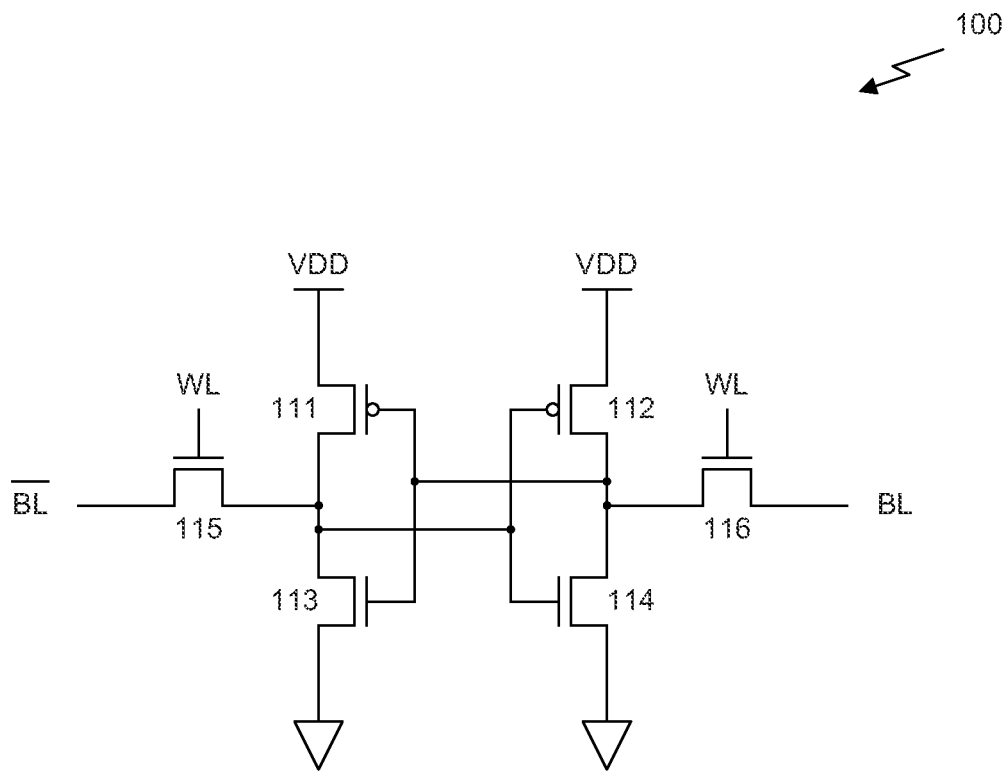
FIG. 1 illustrates a standard 6T SRAM cell, in accordance with the prior art.
Figure 2A:
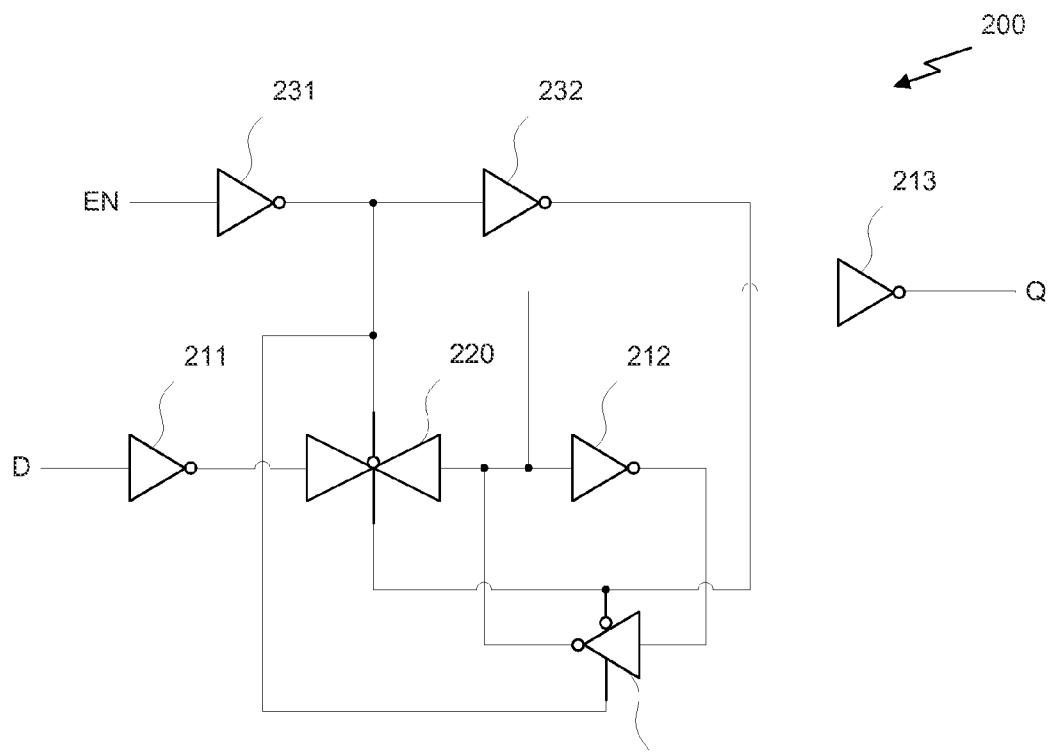
FIG. 2A illustrates a standard latch cell, in accordance with the prior art.

FIG. 2A illustrates a standard latch cell 200, in accordance with the prior art. The latch cell 200 includes sixteen transistors and is significantly larger than the SRAM cell 100. Consequently, the latch cell 200 is not ideal for use as an alternative to the SRAM cell 100. As shown in FIG. 2, the latch cell 200 includes an inverter 211 connected to an input (D) of the latch cell 200. The output of the inverter is coupled to the input of a transmission gate 220. The output of the transmission gate 220 is coupled to the input of a storage element (e.g., a cross-coupled pair of latches) comprising an inverter 212 and a tri-state inverter 215. The output of the inverter 212 is coupled to the input of the tri-state inverter 215, which has an output that is fed back to the input of the inverter 212. The input of the inverter 212 is also coupled to the input of an inverter 213, which generates the output (Q) of the latch cell 200. The transmission gate 220 and the tri-state inverter 215 are controlled by an enable signal (EN) that is coupled to a first inverter 231 that generates a complement to the enable signal and a second inverter 232 that generates a buffered version of the enable signal.

Figure 2B:
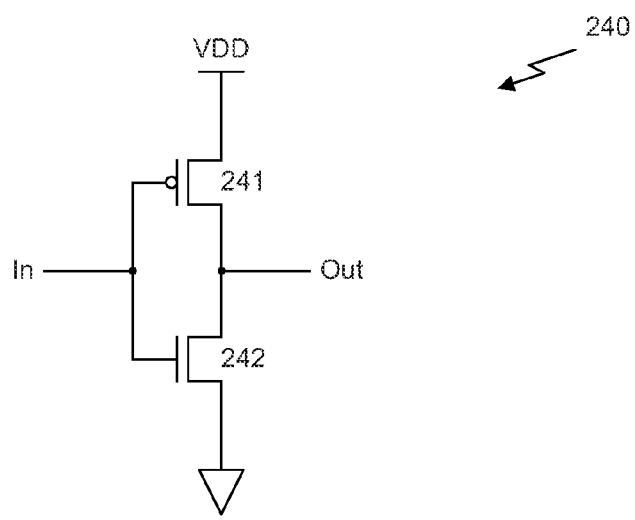
FIG. 2B illustrates a CMOS inverter, in accordance with the prior art.

FIG. 2B illustrates a CMOS inverter 240, in accordance with the prior art. The inverters 211, 212, 213, 231, and 232 in the latch cell 200 may be implemented as the CMOS inverter 240 of FIG. 2B. As shown in FIG. 2B, a standard CMOS inverter 240 may be implemented using a PMOS transistor 241 and an NMOS transistor 242, where the source of the PMOS transistor 241 is coupled to the supply voltage, the drain of the PMOS transistor 241 is coupled to the drain of the NMOS transistor 242, the source of the NMOS transistor 242 is coupled to a ground potential, the gates of the PMOS transistor 241 and the NMOS transistor 242 are coupled to an input of the CMOS inverter 240 and the common node between the drains of the PMOS transistor 241 and the NMOS transistor 242 are coupled to an output of the CMOS inverter 240. The output signal of the CMOS inverter 240 is an inverted version of the input signal.

Figure 2C:
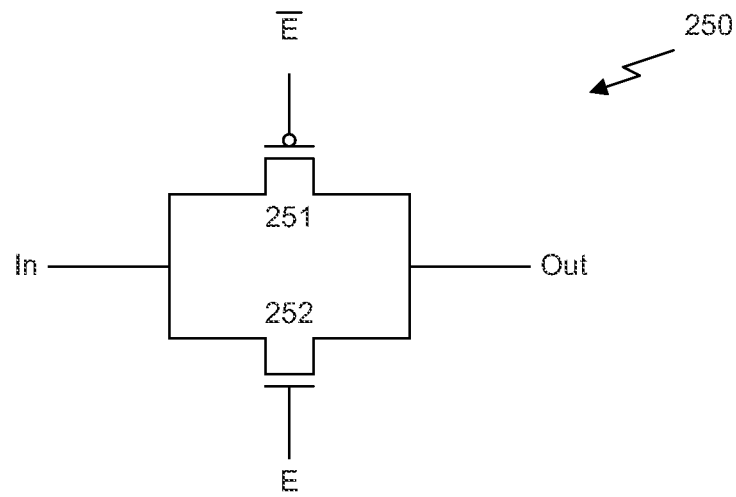
FIG. 2C illustrates a CMOS transmission gate, in accordance with the prior art.

FIG. 2C illustrates a CMOS transmission gate 250, in accordance with the prior art. The transmission gate 220 in the latch cell 200 may be implemented as the CMOS transmission gate 250 of FIG. 2C. As shown in FIG. 2C, the CMOS transmission gate 250 includes a PMOS transistor 251 and an NMOS transistor 252. The source of the PMOS transistor 251 and the source of the NMOS transistor 252 are coupled to a common node as the input to the CMOS transmission gate 250. The drain of the PMOS transistor 251 and the drain of the NMOS transistor 252 are coupled to a common node as the output of the CMOS transmission gate 250. The gate of the PMOS transistor 251 is coupled to a complement of the enable signal and the gate of the NMOS transistor 252 is coupled to the enable signal. When the enable signal is logic-high, the CMOS transmission gate 250 couples the input signal to the output signal, so that the input signal may be passed through to the output signal. When the enable signal is logic-low, the CMOS transmission gate 250 decouples the input signal from the output signal so that the output signal floats.

Figure 2D:
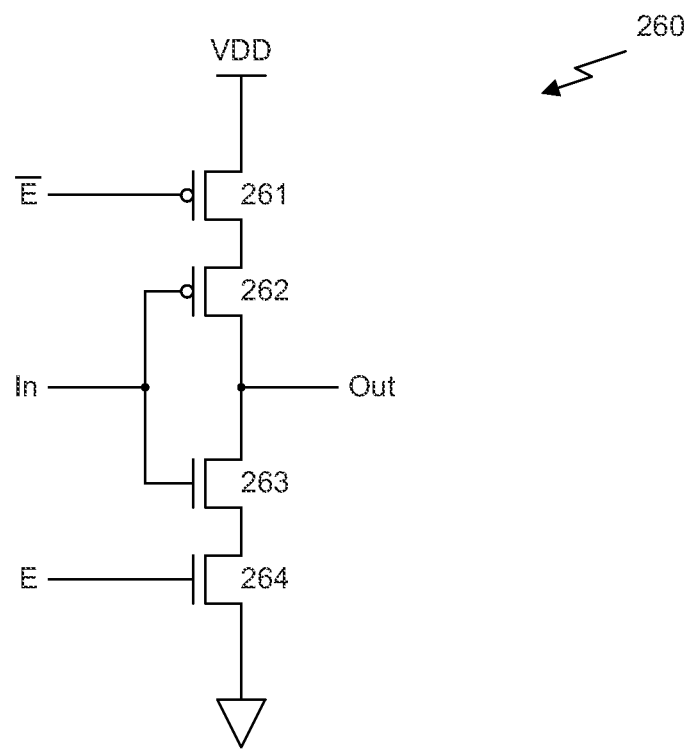
FIG. 2D illustrates a CMOS tri-state inverter, in accordance with the prior art.

FIG. 2D illustrates a CMOS tri-state inverter 260, in accordance with the prior art. The tri-state inverter 215 in the latch cell 200 may be implemented as the CMOS tri-state inverter 260 of FIG. 2D. As shown in FIG. 2D, the CMOS tri-state inverter 260 includes two PMOS transistors 261 and 262 and two NMOS transistors 263 and 264. A source of a first PMOS transistor 261 is coupled to a high supply voltage (i.e., $V_{DD}$). A drain of the first PMOS transistor 261 is coupled to a source of a second PMOS transistor 262, which is coupled to an output of the CMOS tri-state inverter 260. A source of a first NMOS transistor 264 is coupled to a low supply voltage (i.e., VSS or ground). A drain of the first NMOS transistor 264 is coupled to a source of a second NMOS transistor 263. A drain of the second NMOS transistor 263 is coupled to the output of the CMOS tri-state inverter 260. The gates of the second PMOS transistor 262 and the first NMOS transistor 263 are coupled to a common node that is connected to the input of the CMOS tri-state inverter 260. A gate of the first PMOS transistor 261 is coupled to a complement of the enable signal and a gate of the second NMOS transistor 262 is coupled to the enable signal. When the enable signal is logic-low, the CMOS tri-state inverter 260 is in a high-impedance state. When the enable signal is logic--high, the output signal of the CMOS tri-state inverter 260 is the inverted version of the input signal.

It will be appreciated that the order of the PMOS transistors 261 and 262 may be reversed. In other words, a high supply voltage may be coupled to a source terminal of the second PMOS transistor 262, a drain terminal of the second PMOS transistor 262 may he coupled to a source terminal of the first PMOS transistor 261, and a drain terminal of the first PMOS transistor 261 may be coupled to the output of the CMOS tri-state inverter 260. The gate terminals of the first PMOS transistor 261 and the second PMOS transistor 262 may remain the same as shown in FIG. 2D. Simply switching the order of two PMOS transistors between the high supply voltage and the output of the CMOS tri-state inverter 260 does not change the operation of the CMOS tri-state inverter 260. Similarly, the order of the NMOS transistors 263 and 264 may be reversed as well.

Returning now to FIG. 2A, when the enable signal is logic-low, the transmission gate 220 is turned off and the tri-state inverter 215 is turned on; therefore, the storage element (i.e., the inverter 212 and the tri-state inverter 215) is operating in one of two states representing either a bit of logic-low (i.e., 0) or a bit of logic-high (i.e., 1). The output (Q) of the latch cell 200 is decoupled from the storage element via the inverter 213. When the enable signal is logic-high, the transmission gate 220 is turned on and the inverted version of the input (D) of the latch cell 200 is passed to the input of the storage element (i.e., inverter 212). Because the enable signal and the complement of the enable signal are inversely coupled at the enables of the tri-state inverter 215 when compared to the transmission gate 220, the tri-state inverter 215 is switched into a high-impedance state, allowing the inverted version of the input (D) of the latch cell 200 to override the previous state of the storage element. When the enable signal is switched to logic-low, the tri-state inverter 215 is turned on and the storage element continues to store the inverted version of the input (D) of the latch cell 200 even though the transmission gate 220 is turned off. It will be appreciated that the latch cell 200 does not have the same issues as the SRAM cell 100 described above because the input and output of the latch cell 200 are effectively decoupled from the internal node of the storage element during reads and writes of the latch cell 200. However, the latch cell 200 is not ideal for use as an alternate for the SRAM cell 100 because the latch cell 200 is typically much larger than the SRAM cell 100 and, therefore, an array of latch cells 200 cannot store the same amount of data as an array of SRAM cells 100 having the same die footprint on the IC.

Figure 3:
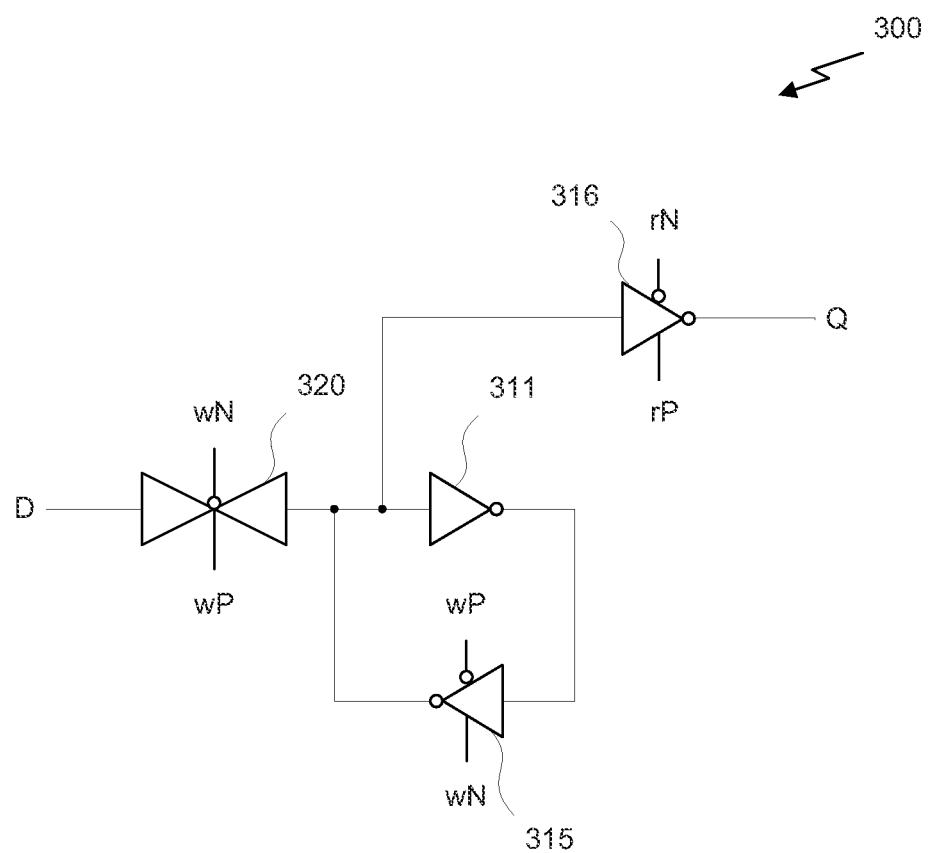
FIG. 3 illustrates a high-density latch cell, in accordance with one embodiment.

FIG. 3 illustrates a high-density latch cell 300, in accordance with one embodiment. The high-density latch cell 300 has a significantly smaller footprint than the standard latch cell 200 shown above because the internal buffers in the standard latch cell 200 are removed from the high-density latch cell 300 and shared among a plurality of high-density latch cells 300 included in an array of latch cells 300. As shown in FIG. 3, the high-density latch cell 300 includes a transmission gate 320 connected to an input (D) signal of the high-density latch cell 300. The output of the transmission gate 320 is coupled to the input of a storage element (i.e., an inverter 311 and a tri-state inverter 315). The output of the inverter 311 is coupled to the input of the tri-state inverter 315, which has an output fed back to the input of the inverter 311. The input of the inverter 311 is also connected to an input of a tri-state inverter 316, which has an output connected to the output (Q) signal of the high-density latch cell 300.

Unlike the standard latch cell 200 which receives an enable signal and buffers the enable signal through two inverters to control the transmission gate 220, and the tri-state inverter 215, the high-density latch cell 300 receives two signals that perform similar functions to the buffered enable signal in the standard latch cell 200. The high-density latch cell 300 receives a write port signal (i.e., wP and a complement of wP, wN) and a read port signal (i.e., rP and a complement of rP, rN). The write port signal is coupled to the transmission gate 320 and the first tri-state inverter 315. When the write port signal is logic-high (i.e., wP=1 and wN=0), then the transmission gate 320 is turned on and the input (D) signal of the high-density latch cell 300 is passed through to the storage element and the first tri-state inverter 315 is placed in a high-impedance state to allow the input (D) signal of the high-density latch cell 300 to override the state of the high-density latch cell 300. When the write port signal is logic-low (i.e., wP=0 and wN=1), the transmission gate 320 is turned off and the first tri-state inverter 315 is turned on; therefore, the storage element (i.e., the inverter 311 and the tri-state inverter 315) is operating in one of two states representing either a bit of logic-low (i.e., 0) or a bit of logic-high (i.e., 1). The read port signal is coupled to the second tri-state inverter 316. When the read port signal is logic-low, then the output of the high-density latch cell 300 is decoupled from the storage element. When the read port signal is logic-high, then the output of the high-density latch cell 300 represents the opposite state of the storage element (i.e., an inverted version of the value stored in the storage element). It will be appreciated that the circuitry used to read the values of the high-density latch cell 300 will need to invert the value that is read at the output (Q) signal of the high-density latch cell 300 in order to determine the value stored in the latch cell.

The high-density latch cell 300 includes 12 transistors instead of the 16 transistors of the standard latch cell 200, resulting in a reduction in the die footprint of the high-density latch cell 300 when compared to standard physical layouts of the latch cell 200. The smaller die footprint enables an array of high-density latch cells 300 to store more data than a corresponding array of latch cells 200, given the same area on the die for the IC. While the high-density latch cell 300 is not quite as small as the SRAM cell 100, the high-density latch cell 300 has other advantages that may make implementing an array of high-density latch cells 300 for storing data on an IC a better choice than using SRAM cells. For example, the latch cells have energy savings when compared to the SRAM cells because the bit lines of a conventional 6T SRAM cell 100 are dynamic nodes that must be pre-charged to a supply voltage at the end of each access cycle and then one of the bit lines is discharged by the cell or peripheral circuits during operation. This changing voltage costs energy when compared to the static operation of transistors in the high-density latch cell 300 during access operations in which the same value is written to the high-density latch cell 300 or a value is read from the high-density latch cell 300.

Figure 4A:
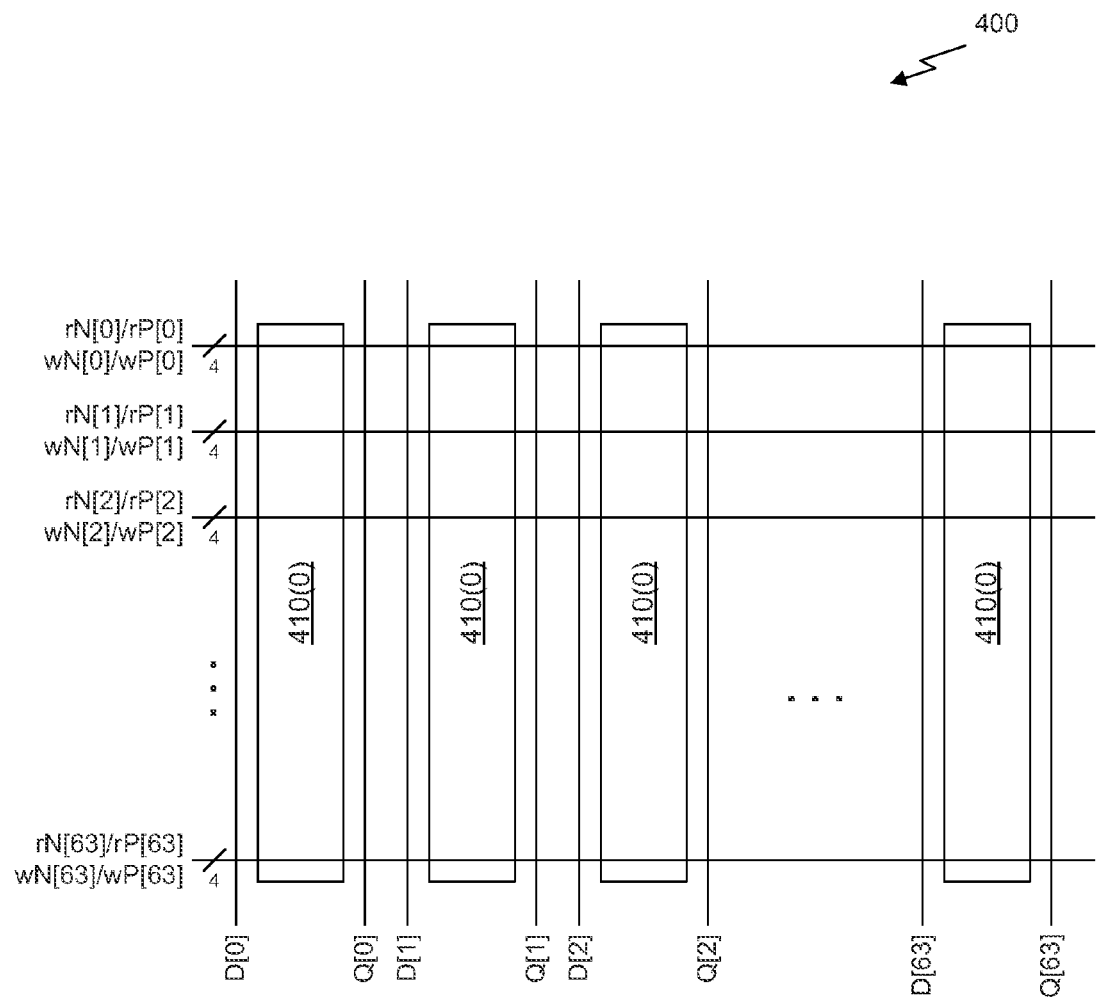
FIGS. 4A through 4C illustrate an array of high-density latch cells, in accordance with one embodiment.
Figure 4B:
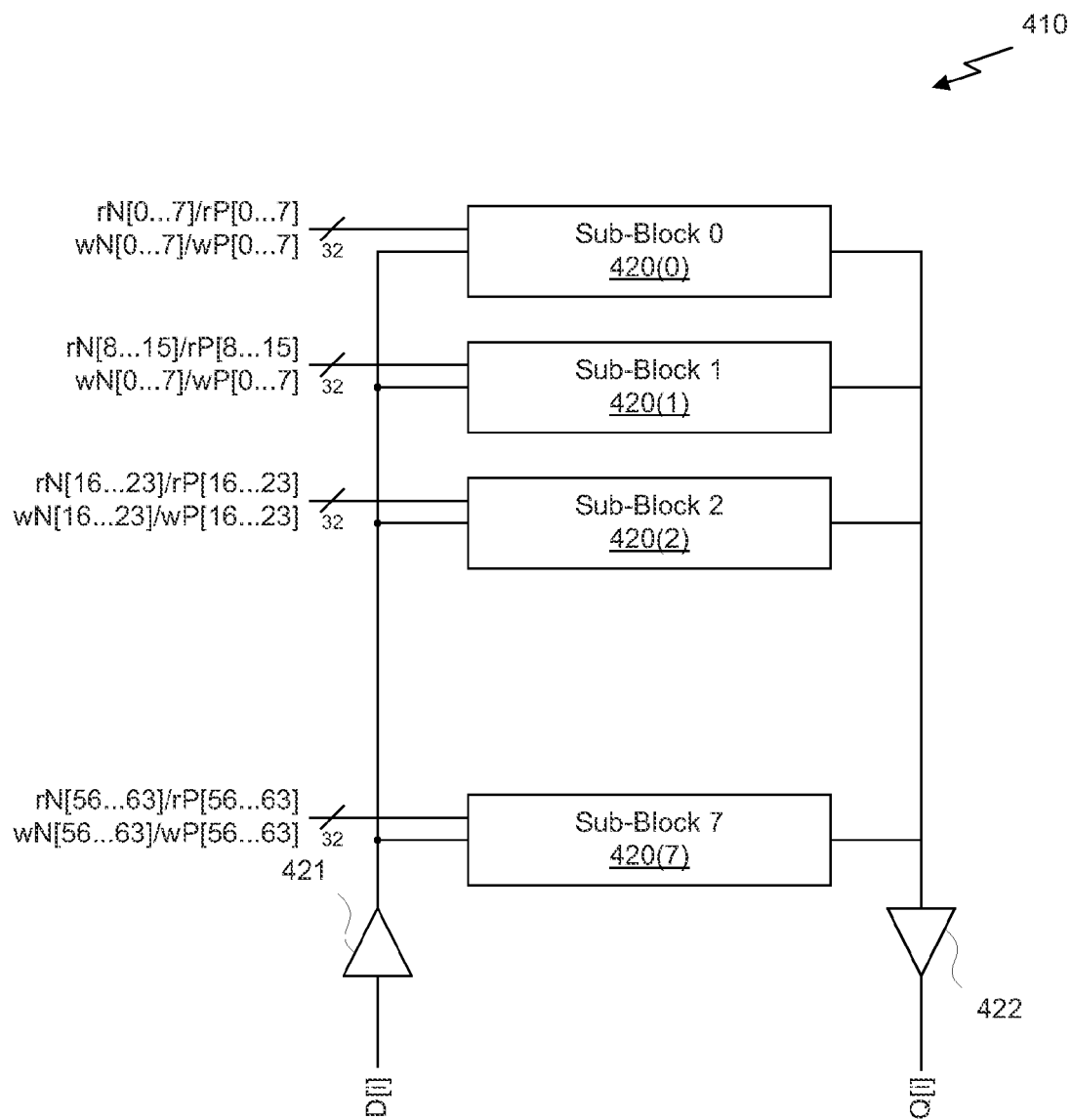
Figure 4C:
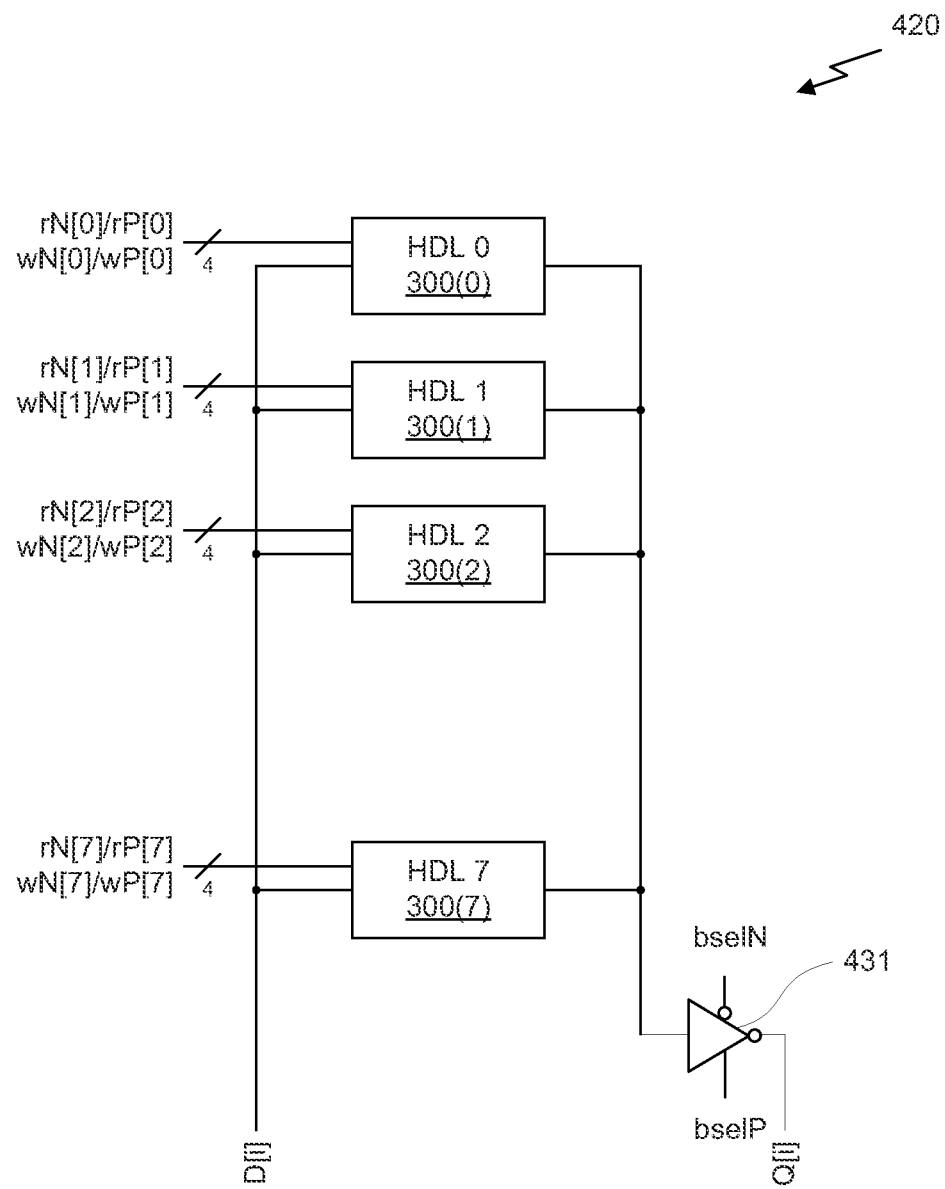

FIGS. 4A through 4C illustrate an array 400 of high-density latch cells 300, in accordance with one embodiment. The high-density latch cell 300 shown in FIG. 3 enables an area-efficient array 400 configuration when the high-density latch cell 300 is configured to exploit shared contacts at the edge of the high-density latch cell 300. In other words, the input (D) signal and output (Q) signal can be shared across multiple cells in a first direction and the read port and write port signals can be shared across multiple cells in a second direction.

As shown in FIG. 4A, the array 400 includes a plurality of high-density latch cells 300 arranged in a number of columns 410. Each column 410 of the array 400 shares an input (D) signal and an output (Q) signal that is one bit wide. Each row of the array 400 shares a pair of complementary signals for the read port and the write port bits. Each column 410 includes one high-density latch cell 300 per row of the array 400. Consequently, a particular row of the array 400 may be addressed for a read operation or a write operation using the read port or write port signals, respectively, and setting the corresponding input (D) signals or reading the corresponding output (Q) signals. In one embodiment, the array 400 is 64 columns wide and 64 rows long, providing 512 bytes of memory. It will be appreciated that the array 400 may be implemented as larger or smaller by changing the width of the read port and write port signals for addressing and/or the width of the input and output signals. For example, the array 400 may be changed to use 128-bit signals for the read port and write port and 256-bit input and output signals to provide 4 kB of memory.

As shown in FIG. 4B, each column 410 of the array 400 may be divided into a plurality of sub-blocks 420. In one embodiment, a column 410 is divided into 8 sub-blocks 420. The input (D) signal is coupled to a driver (i.e., buffer) 421 that provides a current to the sub-blocks 420 in the column. A single input (D) signal is passed to each of the sub-blocks 420 in the column 410. During a read operation, one of the sub-blocks 420 generates an output (Q) signal that is shared on a global output line. The output (Q) signal may be coupled to a second driver 422 that provides a current to transmit the output (Q) signal to a sensing circuit (not explicitly shown) that determines a value stored in the addressed high-density latch cell 300 of the column 410. In another embodiment, each sub-block 420 may include a separate driver for the input (D) signal and the output (Q) signal provided to the sub-block 420.

As shown in FIG. 4C, a sub-block 420 includes a number of high-density latch cells 300. In one embodiment, each sub-block 420 includes eight high-density latch cells 300. Each high-density latch cell 300 in the sub-block 420 is coupled to the input (D) signal for the column 410. Each high-density latch cell 300 is also coupled to a corresponding pair of read port and write port signals. In other words, a particular high-density latch cell 300 in the sub-block 420 is coupled to a pair of complementary signals for the write port (i.e., wN/wP) and a pair of complementary signals for the read port (i.e., rN/rP). These signals control the access operations (i.e., read and write) of the high-density latch cells 300 in the sub-block 420. During a read operation, one of the high-density latch cells 300 generates an output (Q) signal that is shared on a local output line.

In one embodiment, the local output line is coupled to a tri-state inverter 431 that is shared between each of the high-density latch cells 300 in the sub-block 420. The tri-state inverter 431 has two main functions: (1) providing a current to drive the global output line for the column 410; and (2) inverting the value read from the high-density latch cell 300. It will be appreciated that the tri-state inverter 431 is shared among a plurality of high-density latch cells 300 in the array 400. In another embodiment, each high-density latch cell 300 may be strong enough to drive the read port without the assistance of the tri-state inverter 431 and the tri-state inverter 431 may be removed and a single inverter for each column 410 may be included in the sensing circuit to invert the value read from the high-density latch cell 300. In one embodiment, the tri-state inverter 431 may be controlled by a pair of complementary bit select signals (i.e., bselN/bselP). The bit select signals may activate the inverter when any one of the high-density latch cells 300 in the sub-block 420 is accessed as part of a read operation. In other words, all eight of the read port signals associated with the sub-block 420 may be logically ORed to generate the bit select signals.

In operation, data may be written to one row of the array 400 by setting one bit in the write port signal, wP[0 . . . 63], (i.e., one bit of 64 bits in wP is set to a logic-high value) and a complementary version of the write port signal wN[0 . . . 63] is generated based on the write port signal. The bit in the write port signal corresponds to the row of the array 400 to be written. In the same clock cycle, the input signal D[0 . . . 6] is set to the value of the data to be written to the row. Similarly, data may be read from one row of the array 400 by setting one bit in the read port signal, rP[0 . . . 63], (i.e., one bit of 64 bits in rP is set to a logic-high value) and a complementary version of the read port signal rN[0 . . . 63] is generated based on the read port signal. The bit in the read port signal corresponds to the row of the array 400 to be read. In the same clock cycle, the output signal Q[0 . . . 63] may be read by the sensing circuit. It will be appreciated that, during a given clock cycle, exactly one row of data can be written to the array 400 and one row of data can be read from the array 400. The rows of data written to and read from during a given clock cycle may be the same row or different rows.

In another embodiment, additional read or write ports may be provided such that two or more rows of data may be written to or read from the array 400. The additional ports may be implemented by including additional input signal and output signal lines to each column 410 in the array 410, and including separate write port signals for each distinct input signal and separate read port signals for each distinct output signal for each row of the array 400. For example, two input signals, e.g., D0[0 . . . 63] and D1[0 . . . 63], may be implemented along with two write port signals, e.g., wN0[0 . . . 63]/wP0[0 . . . 63] and wN1[0 . . . 63]/wP1[0 . . . 63], in order to provide two separate write ports that allow two different 64-bit values to be written to the array 400 per clock cycle. Similarly, two output signals, e.g., Q0[0 . . . 63] and Q1[0 . . . 63], may be implemented along with two read port signals, e.g., rN0[0 . . . 63]/rP0[0 . . . 63] and rN1[0 . . . 63]/rP1[0 . . . 63], in order to provide two separate read ports that allow two different 64-bit values to be read from the array 400 per clock cycle. In such an embodiment, an additional tri-state inverter, such as tri-state inverter 316, may be included in each high density latch cell 300 for each read port, and an additional transmission gate, such as transmission gate 320, may be included in each high-density latch cell 320 for each independent write port.

In yet another embodiment, the additional read port may be implemented in a hierarchical manner. Each sub-block 420 may only have a single read port (i.e., a single 8-bit signal rN[0 . . . 7]), but multiple tri-state inverters 431 output to different output signals. Such an embodiment enables multiple reads per clock cycle as long as the reads are addressed to different sub-blocks 420. The area overhead for such an implementation is smaller than the area overhead for a full multi-porting implementation as described above.

Figure 5A:
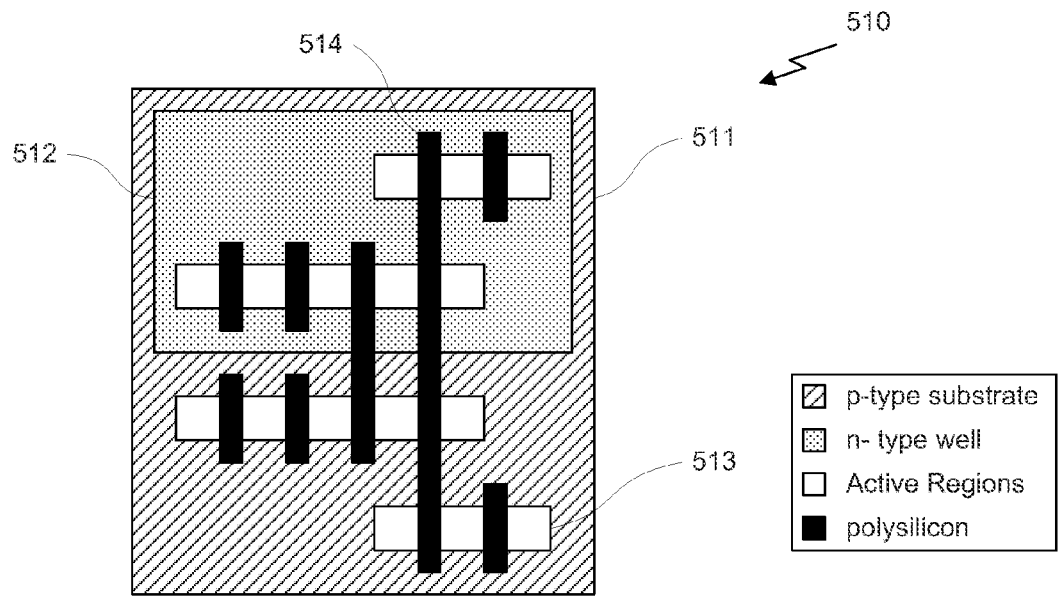
FIG. 5A illustrates a physical layout for a high-density latch cell, in accordance with one embodiment.

FIG. 5A illustrates a physical layout 510 for a high-density latch cell 300, in accordance with one embodiment. As shown in FIG. 5A, the high-density latch cell 300 may be arranged on a semiconductor substrate to implement the various components of the high-density latch cell 300. An n-type well 512 is formed in a p-type substrate 511. The PMOS transistors of the high-density latch cell 300 are formed on top of the n-type well 512 and the NMOS transistors of the high-density latch cell 300 are formed on top of the p-type substrate 511. A plurality of active regions 513 are formed in the p-type substrate 511 and the n-type well 512. The active regions 513 form the basis for the source and the drains for the transistors of the high-density latch cell 300. The active regions 513 in the n-type well 512 area comprise a p-type diffusion layer in the n-type well 512, and the active regions 513 in the p-type substrate 511 area comprise an n-type diffusion layer in the p-type substrate 511. A polysilicon 514 layer is deposited over a dielectric material that forms the gates of the transistors.

Figure 5B:
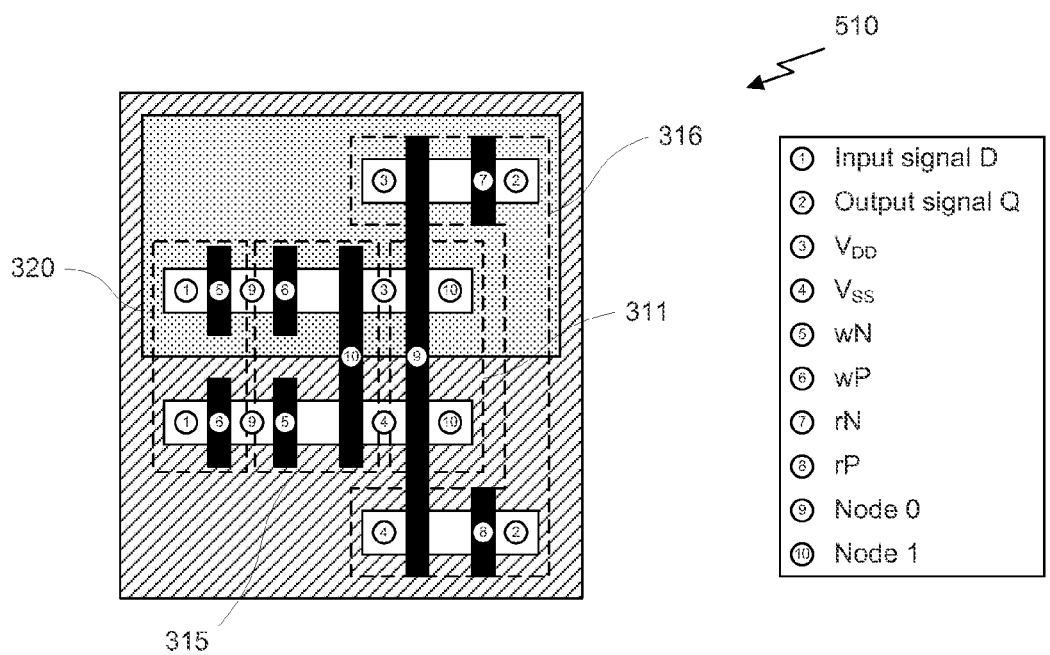
FIG. 5B illustrates the connections for the physical layout of FIG. 5A in order to implement the high-density latch cell of FIG. 3, in accordance with one embodiment.

FIG. 5B illustrates the connections for the physical layout 510 of FIG. 5A in order to implement the high-density latch cell 300 of FIG. 3, in accordance with one embodiment. As shown in FIG. 5B, the transmission gate 320 is implemented using two transistors on the left side of the physical layout 510. The input signal (D) is coupled to the source of a first PMOS transistor and a first common node (i.e., Node 0) is coupled to a drain of the first PMOS transistor. The complementary version of the write port signal, wN, is coupled to the gate of the first PMOS transistor. Similarly, the input signal (D) is coupled to the source of a first NMOS transistor and the first common node (i.e., Node 0) is coupled to a drain of the first NMOS transistor. The write port signal, wP, is coupled to the gate of the first NMOS transistor.

The tri-state inverter 315 is implemented using the next four transistors of the physical layout 510. The first common node is coupled to a drain of a first PMOS transistor, which has a source coupled to a drain of a second PMOS transistor. The source of the second PMOS transistor is coupled to a high supply voltage (i.e., $V_{DD}$). The first PMOS transistor has a gate coupled to the write port signal, wP, and the second PMOS transistor has a gate coupled to a second common node. Similarly, the first common node is coupled to a drain of a first NMOS transistor, which has a source coupled to a drain of a second NMOS transistor. The source of the second NMOS transistor is coupled to a low supply voltage (i.e., $V_{SS}$). The first NMOS transistor has a gate coupled to the complementary version of the write port signal, wN, and the second NMOS transistor has a gate coupled to the second common node.

The inverter 311 is implemented using the next two transistors of the physical layout 510. A source of the PMOS transistor is coupled to a high supply voltage (i.e., $V_{DD}$) and a drain of the PMOS transistor is coupled to the second common node. A source of the NMOS transistor is coupled to a low supply voltage (i.e., $V_{SS}$) and a drain of the NMOS transistor is coupled to the second common node. The gate of the PMOS transistor and the gate of the NMOS transistor are coupled to the first common node. It will be appreciated that the first common node and the second common node comprise the inputs and outputs of the storage element (i.e., the inputs and outputs of the inverter 311 and the tri-state inverter 315).

The tri-state inverter 316 is implemented in the last four transistors of the physical layout 510. A source of a first PMOS transistor is coupled to a high supply voltage (i.e., $V_{DD}$) and a drain of the first PMOS transistor is coupled to a source of a second PMOS transistor. A drain of the second PMOS transistor is coupled to the output signal (Q). A gate of the first PMOS transistor is coupled to the first common node and a gate of the second PMOS transistor is coupled to a complementary version of the read port signal, rN. Similarly, a source of a first NMOS transistor is coupled to a low supply voltage (i.e., $V_{SS}$) and a drain of the first NMOS transistor is coupled to a source of a second NMOS transistor. A drain of the second NMOS transistor is coupled to the output signal (Q). A gate of the first NMOS transistor is coupled to the first common node and a gate of the second NMOS transistor is coupled to the read port signal, rP.

It will be appreciated that the physical layout 510 shown in FIGS. 5A and 5B may not accurately reflect the actual size of the devices or the actual spacing requirements between layers. The physical layout 510 may be suitable for conventional planar MOSFET designs. However, additional size reductions may be possible for other types of MOSFET designs such as FinFETs (i.e., a non-planar, double gate transistor).

Figure 6A:
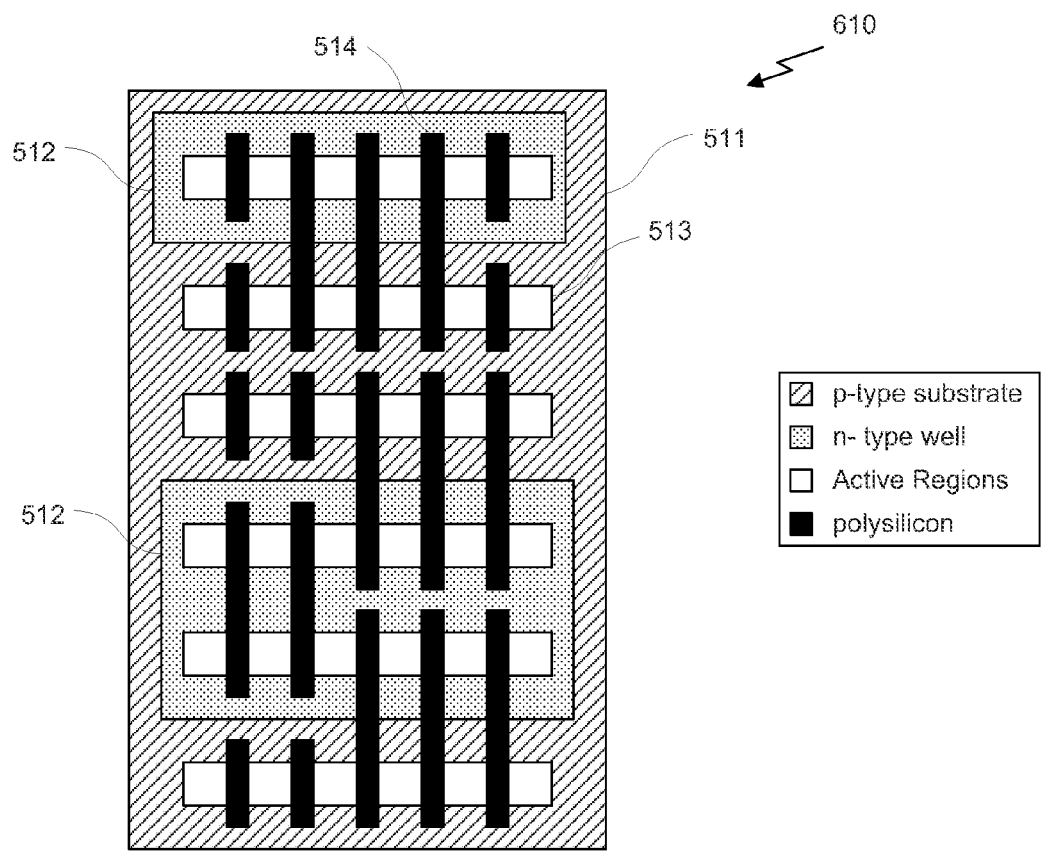
FIG. 6A illustrates a physical layout for a pair of high-density latch cells, in accordance with one embodiment.

FIG. 6A illustrates a physical layout 610 for a pair of high-density latch cells 300, in accordance with one embodiment. The manufacture of FinFET devices may use uniform width active regions rather than variable width active regions used in the physical layout 510. In such a design, an additional reduction of the die footprint for the array 400 may be realized by sharing some signals between adjacent cells.

As shown in FIG. 6A, the physical layout 610 may be used to implement two high-density latch cells 300 where the bottom half of the physical layout 610 implements the write ports and cross-coupled inverter pairs (i.e., storage elements) and the top half of the physical layout 610 implements the read ports and the tri-state read buffers. As shown in FIG. 6A, the pair of high-density latch cells 300 may be arranged on a semiconductor substrate to implement the various components of the high-density latch cells 300. Two separate regions of n-type well 512 are formed in the p-type substrate 511. The PMOS transistors of the high-density latch cells 300 are formed on top of the n-type well 512 and the NMOS transistors of the high-density latch cells 300 are formed on top of the p-type substrate 511. Again, a plurality of active regions 513 are formed in the p-type substrate 511 and the n-type well 512. In one embodiment, where the devices of the high-density latch cells are implemented as FinFETs, the active regions 513 extend above a top surface of the p-type substrate 511 to form "fins" such that the polysilicon 514 layers that form the gates of the transistors surround three surfaces of the active region.

Figure 6B:
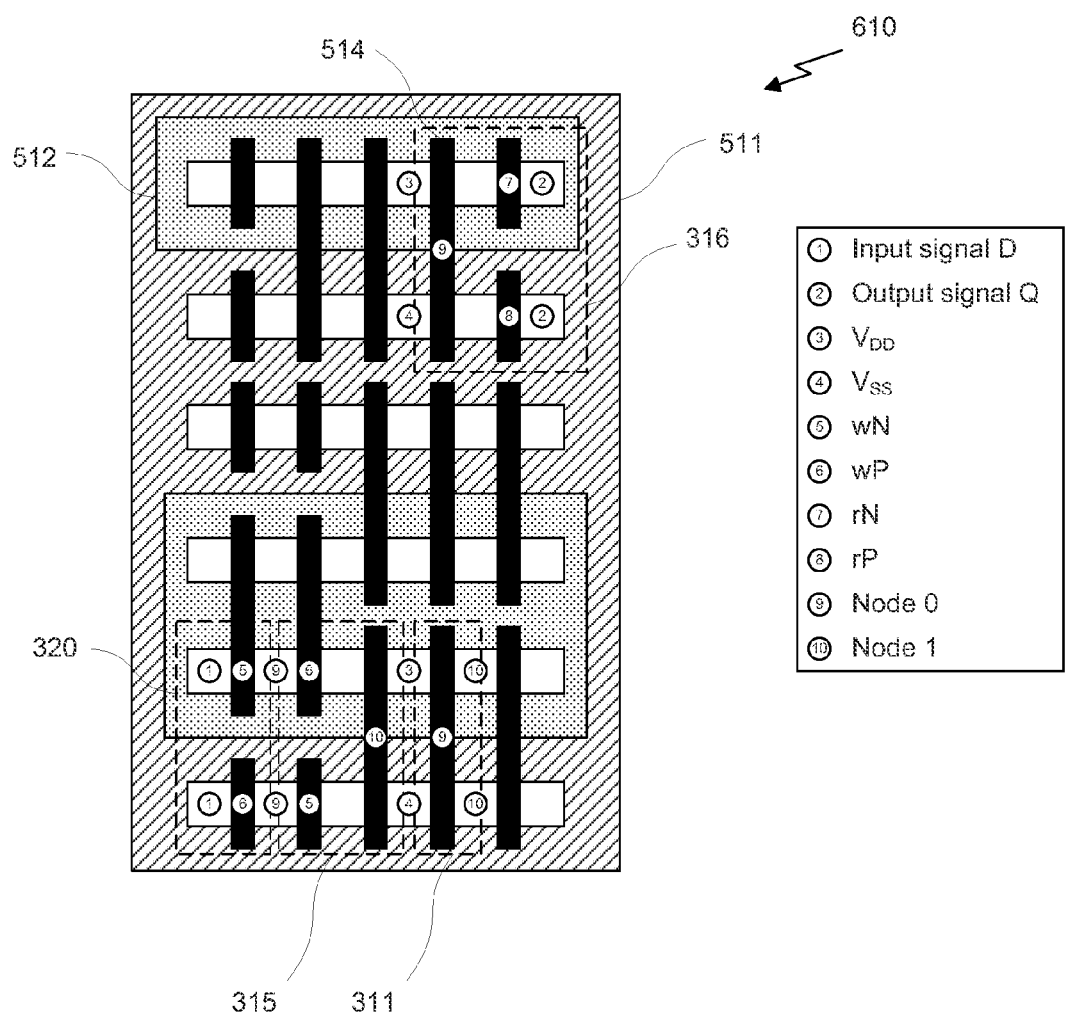
FIGS. 6B & 6C illustrate the connections for the pair of high-density latch cells implemented by the physical layout of FIG. 6A, in accordance with one embodiment.
Figure 6C:
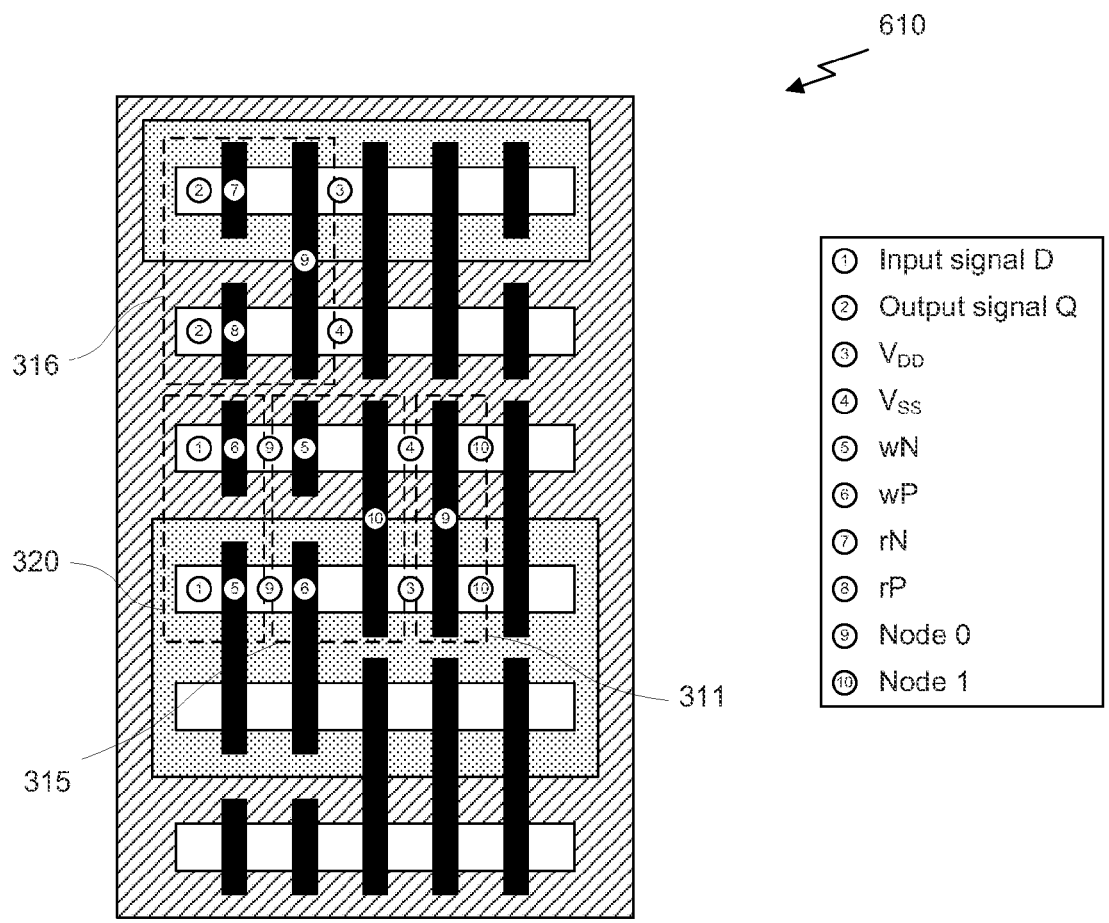

FIGS. 6B & 6C illustrate the connections for a pair of high-density latch cells 300 implemented by the physical layout 610 of FIG. 6A, in accordance with one embodiment. Again, the physical layout 610 for a pair of high-density latch cells 300 is slightly smaller than two physical layouts 510 for two separate high-density latch cells 300 and, therefore, arrays 400 implemented using the physical layout 610 have a smaller footprint than similar capacity arrays 400 implemented using the physical layout 510.

As shown in FIG. 6B, a first subset of transistors in the bottom portion of the physical layout 610 implement the transmission gate 320, the tri-state inverter 315, and the inverter 311 for a first high-density latch cell 300 in the pair of high-density latch cells 300 implemented by the physical layout 610. Similarly, a first subset of transistors in the top portion of the physical layout 610 implement the tri-state inverter 316 for the first high-density latch cell 300.

As shown in FIG. 6C, a second subset of transistors in the bottom portion of the physical layout 610 implement the transmission gate 320, the tri-state inverter 315, and the inverter 311 for a second high-density latch cell 300 in the pair of high-density latch cells 300 implemented by the physical layout 610. Similarly, a second subset of transistors in the top portion of the physical layout 610 implement the tri-state inverter 316 for the second high-density latch cell 300.

It will be appreciated that a handful of transistors in the physical layout 610 are not used to implement the pair of high-density latch cells 300 implemented by the physical layout 610. As shown in FIGS. 6B and 6C, six gates are not coupled to any signals for either the first high-density latch cell 300 implementation or the second high-density latch cell 300 implementation. Such transistors may be dummy devices or may be used for other purposes.

Again, the arrays 400 of high-density latch cells 300 have various benefits over SRAM cells 100 when used to store data in integrated circuits. For example, the high-density latch cells 300 dissipate less energy per access operation when compared to a standard SRAM cell 100, which is mainly due to the reduction in internal switching activity. Consequently, high-density latch cells 300 may be considered as a replacement for some SRAM cells 100 in certain processor designs. An illustration of one implementation for using arrays 400 of high-density latch cells 300 to replace SRAM cells 100 in a parallel processing unit is described below.

Parallel Processing Unit

Figure 7:
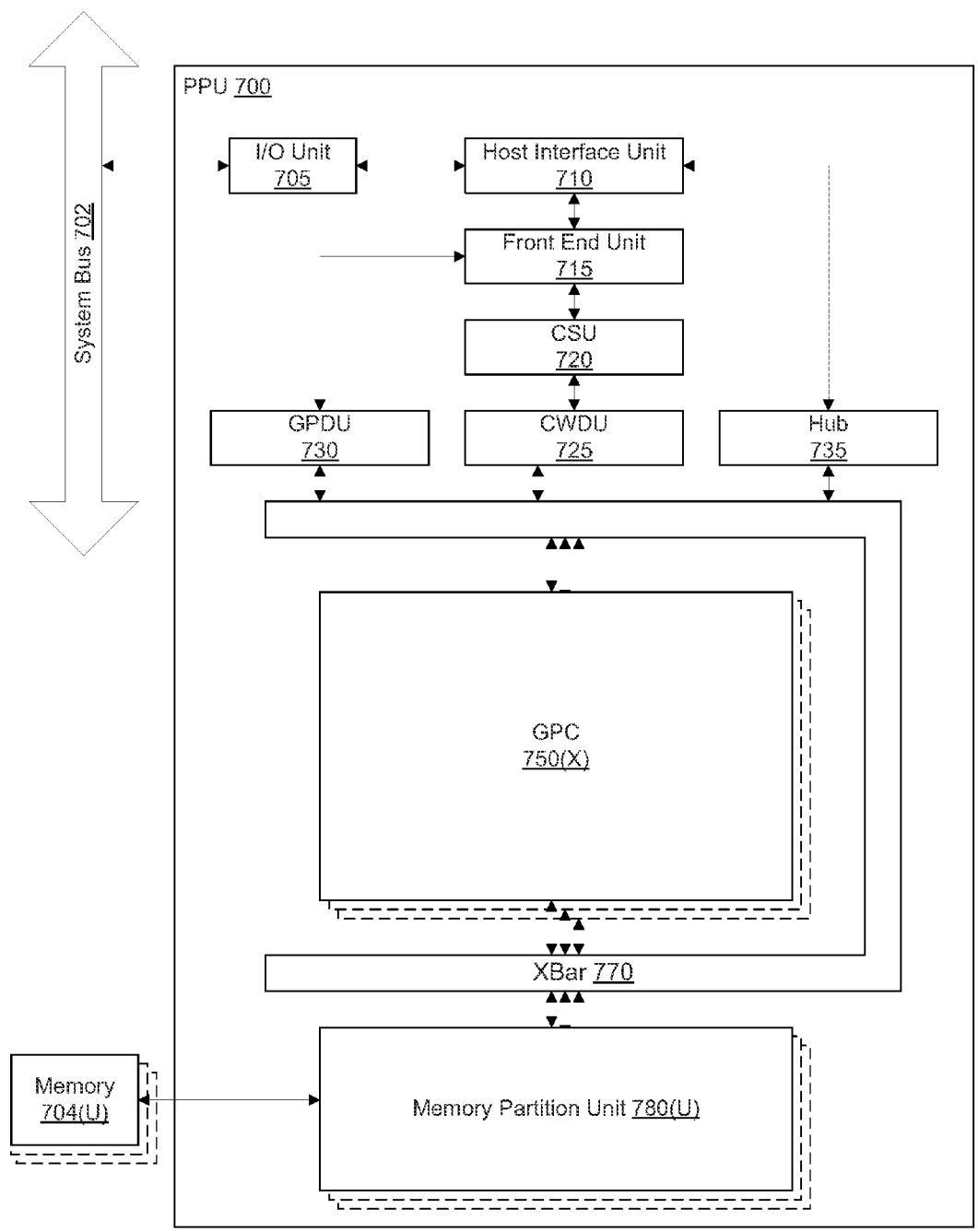
FIG. 7 illustrates a parallel processing unit, in accordance with one embodiment.

FIG. 7 illustrates a parallel processing unit (PPU) 700, in accordance with one embodiment. In one embodiment, the PPU 700 is a multi-threaded processor that is implemented on one or more integrated circuit devices. The PPU 700 is a latency hiding architecture designed to process a large number of threads in parallel. A thread (i.e., a thread of execution) is an instantiation of a set of instructions configured to be executed by the PPU 700. In one embodiment, the PPU 700 is a graphics processing unit (GPU) configured to implement a graphics rendering pipeline for processing three-dimensional (3D) graphics data in order to generate two-dimensional (2D) image data for display on a display device such as a liquid crystal display (LCD) device. In other embodiments, the PPU 700 may be utilized for performing general-purpose computations. While one exemplary parallel processor is provided herein for illustrative purposes, it should be strongly noted that such processor is set forth for illustrative purposes only, and that any processor may be employed to supplement and/or substitute for the same.

As shown in FIG. 7, the PPU 700 includes an Input/Output (I/O) unit 705, a host interface unit 710, a front end unit 715, a scheduler unit 720, a work distribution unit 725, a hub 730, a crossbar (Xbar) 770, one or more general processing clusters (GPCs) 750, and one or more partition units 780. The PPU 700 may be connected to a host processor or other peripheral devices via a system bus 702. The PPU 700 may also be connected to a local memory comprising a number of memory devices 704. In one embodiment, the local memory may comprise a number of dynamic random access memory (DRAM) devices.

The I/O unit 705 is configured to transmit and receive communications (i.e., commands, data, etc.) from a host processor (not shown) over the system bus 702. The I/O unit 705 may communicate with the host processor directly via the system bus 702 or through one or more intermediate devices such as a memory bridge. In one embodiment, the I/O unit 705 implements a Peripheral Component Interconnect Express (PCIe) interface for communications over a PCIe bus. In alternative embodiments, the I/O unit 705 may implement other types of well-known interfaces for communicating with external devices.

The I/O unit 705 is coupled to a host interface unit 710 that decodes packets received via the system bus 702. In one embodiment, the packets represent commands configured to cause the PPU 700 to perform various operations. The host interface unit 710 transmits the decoded commands to various other units of the PPU 700 as the commands may specify. For example, some commands may be transmitted to the front end unit 715. Other commands may be transmitted to the hub 730 or other units of the PPU 700 such as one or more copy engines, a video encoder, a video decoder, a power management unit, etc. (not explicitly shown). In other words, the host interface unit 710 is configured to route communications between and among the various logical units of the PPU 700.

In one embodiment, a program executed by the host processor encodes a command stream in a buffer that provides workloads to the PPU 700 for processing. A workload may comprise a number of instructions and data to be processed by those instructions. The buffer is a region in a memory that is accessible (i.e., read/write) by both the host processor and the PPU 700. For example, the host interface unit 710 may be configured to access the buffer in a system memory connected to the system bus 702 via memory requests transmitted over the system bus 702 by the I/O unit 705. In one embodiment, the host processor writes the command stream to the buffer and then transmits a pointer to the start of the command stream to the PPU 700. The host interface unit 710 provides the front end unit 715 with pointers to one or more command streams. The front end unit 715 manages the one or more streams, reading commands from the streams and forwarding commands to the various units of the PPU 700.

The front end unit 715 is coupled to a scheduler unit 720 that configures the various GPCs 750 to process tasks defined by the one or more streams. The scheduler unit 720 is configured to track state information related to the various tasks managed by the scheduler unit 720. The state may indicate which GPC 750 a task is assigned to, whether the task is active or inactive, a priority level associated with the task, and so forth. The scheduler unit 720 manages the execution of a plurality of tasks on the one or more GPCs 750.

The scheduler unit 720 is coupled to a work distribution unit 725 that is configured to dispatch tasks for execution on the GPCs 750. The work distribution unit 725 may track a number of scheduled tasks received from the scheduler unit 720. In one embodiment, the work distribution unit 725 manages a pending task pool and an active task pool for each of the GPCs 750. The pending task pool may comprise a number of slots (e.g., 16 slots) that contain tasks assigned to be processed by a particular GPC 750. The active task pool may comprise a number of slots (e.g., 4 slots) for tasks that are actively being processed by the GPCs 750. As a GPC 750 finishes the execution of a task, that task is evicted from the active task pool for the GPC 750 and one of the other tasks from the pending task pool is selected and scheduled for execution on the GPC 750. If an active task has been idle on the GPC 750, such as while waiting for a data dependency to be resolved, then the active task may be evicted from the GPC 750 and returned to the pending task pool while another task in the pending task pool is selected and scheduled for execution on the GPC 750.

The work distribution unit 725 communicates with the one or more GPCs 750 via a XBar 770. The XBar 770 is an interconnect network that couples many of the units of the PPU 700 to other units of the PPU 700. For example, the XBar 770 may be configured to couple the work distribution unit 725 to a particular GPC 750. Although not shown explicitly, one or more other units of the PPU 700 are coupled to the host unit 710. The other units may also be connected to the XBar 770 via a hub 730.

The tasks are managed by the scheduler unit 720 and dispatched to a GPC 750 by the work distribution unit 725. The GPC 750 is configured to process the task and generate results. The results may be consumed by other tasks within the GPC 750, routed to a different GPC 750 via the XBar 770, or stored in the memory 704. The results can be written to the memory 704 via the partition units 780, which implement a memory interface for reading and writing data to/from the memory 704. In one embodiment, the PPU 700 includes a number U of partition units 780 that is equal to the number of separate and distinct memory devices 704 coupled to the PPU 700. A partition unit 780 will be described in more detail below in conjunction with FIG. 8B.

In one embodiment, a host processor executes a driver kernel that implements an application programming interface (API) that enables one or more applications executing on the host processor to schedule operations for execution on the PPU 700. An application may generate instructions (i.e., API calls) that cause the driver kernel to generate one or more tasks for execution by the PPU 700. The driver kernel outputs tasks to one or more streams being processed by the PPU 700. Each task may comprise one or more groups of related threads, referred to herein as a warp. A thread block may refer to a plurality of groups of threads including instructions to perform the task. Threads in the same group of threads may exchange data through shared memory. In one embodiment, a group of threads comprises 32 related threads.

Figure 8A:
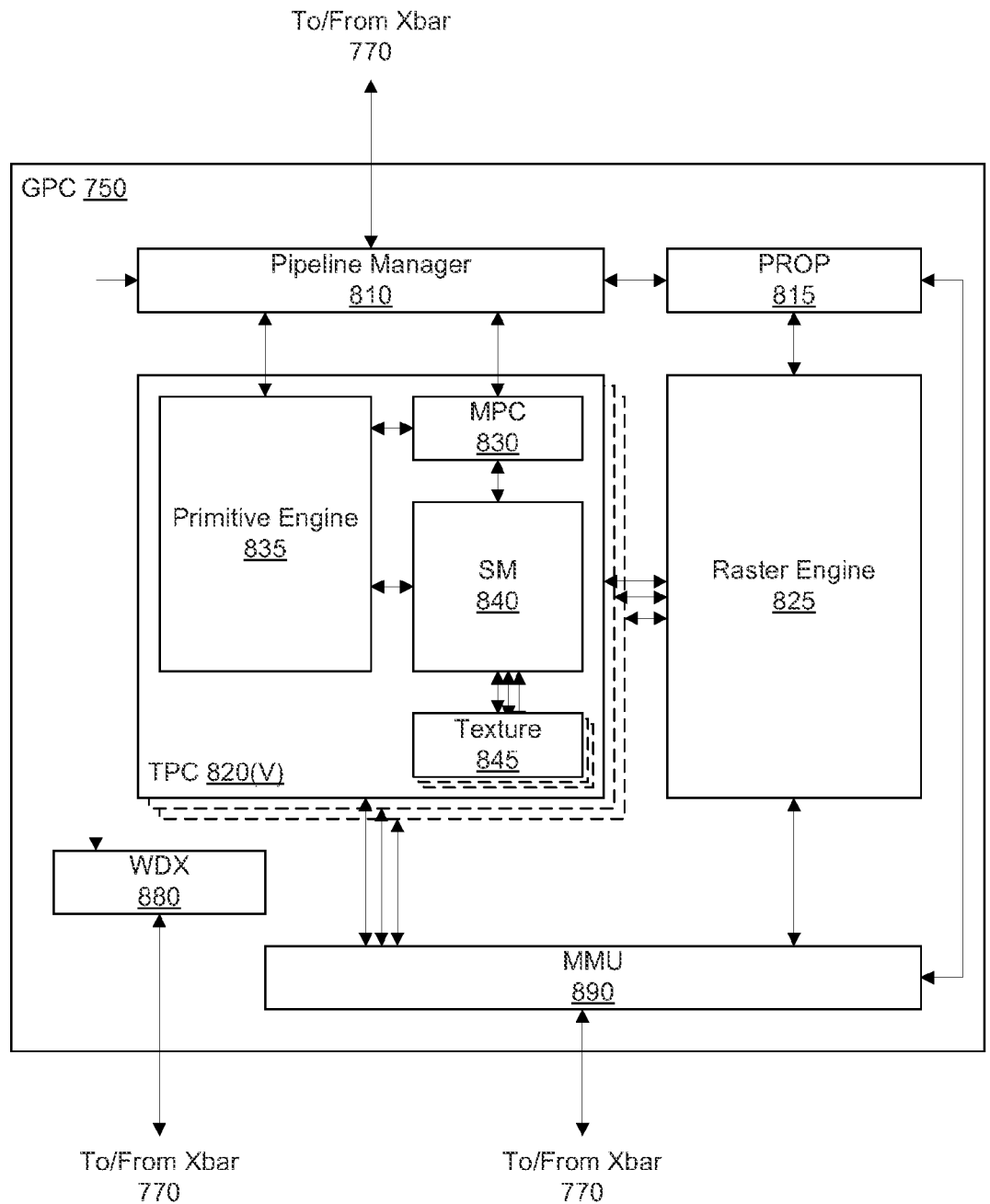
FIG. 8A illustrates a general processing cluster of the parallel processing unit of FIG. 7, in accordance with one embodiment.

FIG. 8A illustrates a GPC 750 of the PPU 700 of FIG. 7, in accordance with one embodiment. As shown in FIG. 8A, each GPC 750 includes a number of hardware units for processing tasks. In one embodiment, each GPC 750 includes a pipeline manager 810, a pre-raster operations unit (PROP) 815, a raster engine 825, a work distribution crossbar (WDX) 880, a memory management unit (MMU) 890, and one or more Texture Processing Clusters (TPCs) 820. It will be appreciated that the GPC 750 of FIG. 8A may include other hardware units in lieu of or in addition to the units shown in FIG. 8A.

In one embodiment, the operation of the GPC 750 is controlled by the pipeline manager 810. The pipeline manager 810 manages the configuration of the one or more TPCs 820 for processing tasks allocated to the GPC 750. In one embodiment, the pipeline manager 810 may configure at least one of the one or more TPCs 820 to implement at least a portion of a graphics rendering pipeline. For example, a TPC 820 may be configured to execute a vertex shader program on the programmable streaming multiprocessor (SM) 840. The pipeline manager 810 may also be configured to route packets received from the work distribution unit 725 to the appropriate logical units within the GPC 750. For example, some packets may be routed to fixed function hardware units in the PROP 815 and/or raster engine 825 while other packets may be routed to the TPCs 820 for processing by the primitive engine 835 or the SM 840.

The PROP unit 815 is configured to route data generated by the raster engine 825 and the TPCs 820 to a Raster Operations (ROP) unit in the partition unit 780, described in more detail below. The PROP unit 815 may also be configured to perform optimizations for color blending, organize pixel data, perform address translations, and the like.

The raster engine 825 includes a number of fixed function hardware units configured to perform various raster operations. In one embodiment, the raster engine 825 includes a setup engine, a course raster engine, a culling engine, a clipping engine, a fine raster engine, and a tile coalescing engine. The setup engine receives transformed vertices and generates plane equations associated with the geometric primitive defined by the vertices. The plane equations are transmitted to the coarse raster engine to generate coverage information (e.g., an x,y coverage mask for a tile) for the primitive. The output of the coarse raster engine may transmitted to the culling engine where fragments associated with the primitive that fail a z-test are culled, and transmitted to a clipping engine where fragments lying outside a viewing frustum are clipped. Those fragments that survive clipping and culling may be passed to a fine raster engine to generate attributes for the pixel fragments based on the plane equations generated by the setup engine. The output of the raster engine 880 comprises fragments to be processed, for example, by a fragment shader implemented within a TPC 820.

Each TPC 820 included in the GPC 750 includes an M-Pipe Controller (MPC) 830, a primitive engine 835, an SM 840, and one or more texture units 845. The MPC 830 controls the operation of the TPC 820, routing packets received from the pipeline manager 810 to the appropriate units in the TPC 820. For example, packets associated with a vertex may be routed to the primitive engine 835, which is configured to fetch vertex attributes associated with the vertex from the memory 704. In contrast, packets associated with a shader program may be transmitted to the SM 840.

In one embodiment, the texture units 845 are configured to load texture maps (e.g., a 2D array of texels) from the memory 704 and sample the texture maps to produce sampled texture values for use in shader programs executed by the SM 840. The texture units 845 implement texture operations such as filtering operations using mip-maps (i.e., texture maps of varying levels of detail). In one embodiment, each TPC 820 includes four (4) texture units 845.

The SM 840 comprises a programmable streaming processor that is configured to process tasks represented by a number of threads. Each SM 840 is multi-threaded and configured to execute a plurality of threads (e.g., 32 threads) from a particular group of threads concurrently. In one embodiment, the SM 840 implements a SIMD (Single-Instruction, Multiple-Data) architecture where each thread in a group of threads (i.e., a warp) is configured to process a different set of data based on the same set of instructions. All threads in the group of threads execute the some instructions. In another embodiment, the SM 840 implements a SIMT (Single-Instruction, Multiple Thread) architecture where each thread in a group of threads is configured to process a different set of data based on the same set of instructions, but where individual threads in the group of threads are allowed to diverge during execution. In other words, when an instruction for the group of threads is dispatched for execution, some threads in the group of threads may be active, thereby executing the instruction, while other threads in the group of threads may be inactive, thereby performing a no-operation (NOP) instead of executing the instruction. The SM 840 may be described in more detail below in conjunction with FIG. 9.

The MMU 890 provides an interface between the GPC 750 and the partition unit 780. The MMU 890 may provide translation of virtual addresses into physical addresses, memory protection, and arbitration of memory requests. In one embodiment, the MMU 890 provides one or more translation lookaside buffers (TLBs) for improving translation of virtual addresses into physical addresses in the memory 704.

Figure 8B:
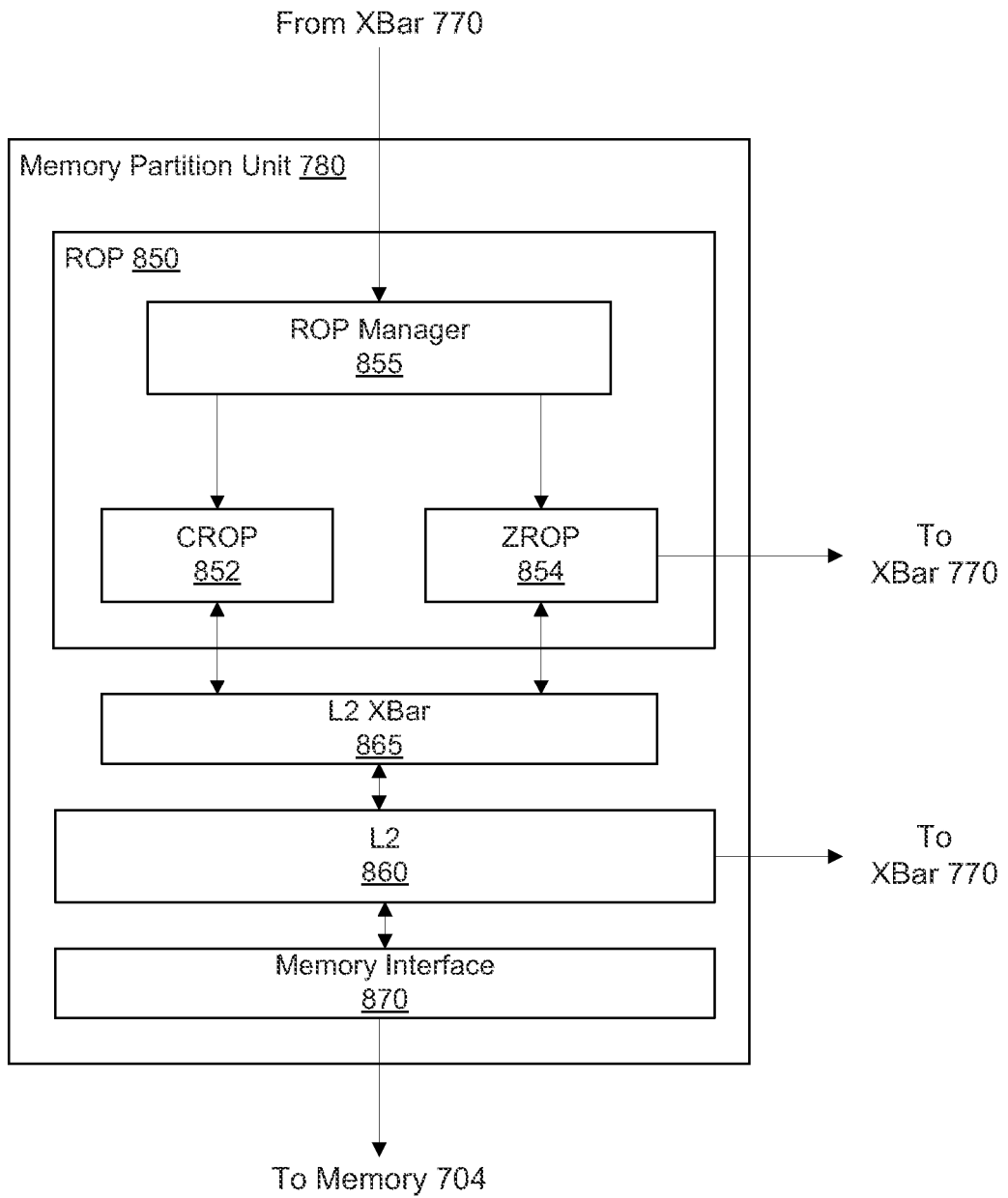
FIG. 8B illustrates a partition unit of the parallel processing unit of FIG. 7, in accordance with one embodiment.

FIG. 8B illustrates a partition unit 780 of the PPU 700 of FIG. 7, in accordance with one embodiment. As shown in FIG. 8B, the partition unit 780 includes a Raster Operations (ROP) unit 850, a level two (L2) cache 860, a memory interface 870, and an L2 crossbar (XBar) 865. The memory interface 870 is coupled to the memory 704. Memory interface 870 may implement 16, 32, 64, 128-bit data buses, or the like, for high-speed data transfer. In one embodiment, the PPU 700 comprises U memory interfaces 870, one memory interface 870 per partition unit 780, where each partition unit 780 is connected to a corresponding memory device 704. For example, PPU 700 may be connected to up to U memory devices 704, such as graphics double-data-rate, version 5, synchronous dynamic random access memory (GDDR5 SDRAM). In one embodiment, the memory interface 870 implements a DRAM interface and U is equal to 6.

In one embodiment, the PPU 700 implements a multi-level memory hierarchy. The memory 704 is located off-chip in SDRAM coupled to the PPU 700. Data from the memory 704 may be fetched and stored in the L2 cache 860, which is located on-chip and is shared between the various GPCs 750. As shown, each partition unit 780 includes a portion of the L2 cache 860 associated with a corresponding memory device 704. Lower level caches may then be implemented in various units within the GPCs 750. For example, each of the SMs 840 may implement a level one (L1) cache. The L1 cache is private memory that is dedicated to a particular SM 840. Data from the L2 cache 860 may be fetched and stored in each of the L1 caches for processing in the functional units of the SMs 840. The L2 cache 860 is coupled to the memory interface 870 and the XBar 770.

The ROP unit 850 includes a ROP Manager 855, a Color ROP (CROP) unit 852, and a Z ROP (ZROP) unit 854. The CROP unit 852 performs raster operations related to pixel color, such as color compression, pixel blending, and the like.

The ZROP unit 854 implements depth testing in conjunction with the raster engine 825. The ZROP unit 854 receives a depth for a sample location associated with a pixel fragment from the culling engine of the raster engine 825. The ZROP unit 854 tests the depth against a corresponding depth in a depth buffer for a sample location associated with the fragment. If the fragment passes the depth test for the sample location, then the ZROP unit 854 updates the depth buffer and transmits a result of the depth test to the raster engine 825. The ROP Manager 855 controls the operation of the ROP unit 850. It will be appreciated that the number of partition units 780 may be different than the number of GPCs 750 and, therefore, each ROP unit 850 may be coupled to each of the GPCs 750. Therefore, the ROP Manager 855 tracks packets received from the different GPCs 750 and determines which GPC 750 that a result generated by the ROP unit 850 is routed to. The CROP unit 852 and the ZROP unit 854 are coupled to the L2 cache 860 via an L2 XBar 865.

Figure 9:
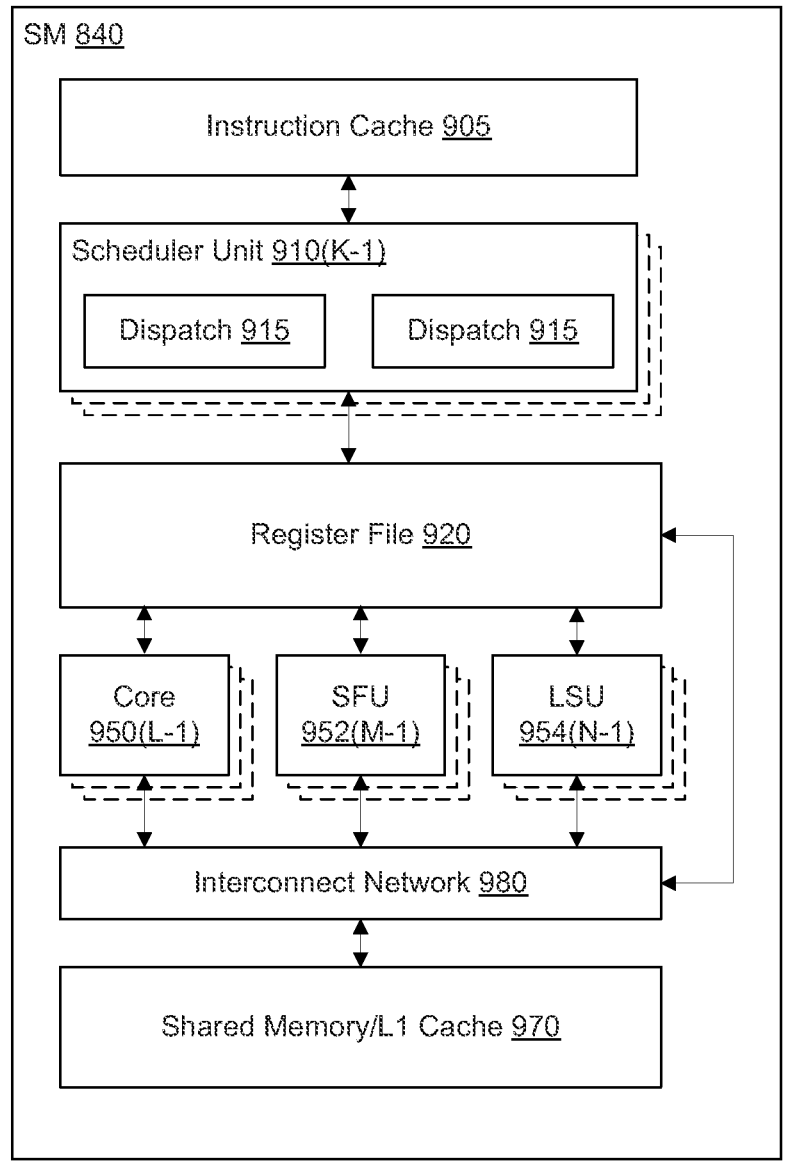
FIG. 9 illustrates the streaming multi-processor of FIG. 8A, in accordance with one embodiment.

FIG. 9 illustrates the streaming multi-processor 840 of FIG. 8A, in accordance with one embodiment. As shown in FIG. 9, the SM 840 includes an instruction cache 905, one or more scheduler units 910, a register file 920, one or more processing cores 950, one or more special function units (SFUs) 952, one or more load/store units (LSUs) 954, an interconnect network 980, and a shared memory/L1 cache 970.

As described above, the work distribution unit 725 dispatches tasks for execution on the GPCs 750 of the PPU 700. The tasks are allocated to a particular TPC 820 within a GPC 750 and, if the task is associated with a shader program, the task may be allocated to an SM 840. The scheduler unit 910 receives the tasks from the work distribution unit 725 and manages instruction scheduling for one or more groups of threads (i.e., warps) assigned to the SM 840. The scheduler unit 910 schedules threads for execution in groups of parallel threads, where each group is called a warp. In one embodiment, each warp includes 32 threads. The scheduler unit 910 may manage a plurality of different warps, scheduling the warps for execution and then dispatching instructions from the plurality of different warps to the various functional units (i.e., cores 850, SFUs 852, and LSUs 854) during each clock cycle.

In one embodiment, each scheduler unit 910 includes one or more instruction dispatch units 915. Each dispatch unit 915 is configured to transmit instructions to one or more of the functional units. In the embodiment shown in FIG. 9, the scheduler unit 910 includes two dispatch units 915 that enable two different instructions from the same warp to be dispatched during each clock cycle. In alternative embodiments, each scheduler unit 910 may include a single dispatch unit 915 or additional dispatch units 915.

Each SM 840 includes a register file 920 that provides a set of registers for the functional units of the SM 840. In one embodiment, the register file 920 is divided between each of the functional units such that each functional unit is allocated a dedicated portion of the register file 920. In another embodiment, the register file 920 is divided between the different warps being executed by the SM 840. The register file 920 provides temporary storage for operands connected to the data paths of the functional units.

Each SM 840 comprises L processing cores 950. In one embodiment, the SM 840 includes a large number (e.g., 192, etc.) of distinct processing cores 950. Each core 950 may include a fully-pipelined, single-precision processing unit that includes a floating point arithmetic logic unit and an integer arithmetic logic unit. The core 950 may also include a double-precision processing unit including a floating point arithmetic logic unit. In one embodiment, the floating point arithmetic logic units implement the IEEE 754-2008 standard for floating point arithmetic. Each SM 840 also comprises M SFUs 952 that perform special functions (e.g., pixel blending operations, and the like), and N LSUs 954 that implement load and store operations between the shared memory/L1 cache 970 and the register file 920. In one embodiment, the SM 840 includes 192 cores 950, 32 SFUs 952, and 32 LSUs 954.

Each SM 840 includes an interconnect network 980 that connects each of the functional units to the register file 920 and the shared memory/L1 cache 970. In one embodiment, the interconnect network 980 is a crossbar that can be configured to connect any of the functional units to any of the registers in the register file 920 or the memory locations in shared memory/L1 cache 970.

The shared memory/L1 cache 970 is an array of on-chip memory that, in one embodiment, may be configured as either shared memory or an L1 cache, or a combination of both, as the application demands. For example, the shared memory/L1 cache 970 may comprise 64 kB of storage capacity. The shared memory/L1 cache 970 may be configured as 64 kB of either shared memory or L1 cache, or a combination of the two such as 16 kB of L1 cache and 48 kB of shared memory.

The PPU 700 described above may be configured to perform highly parallel computations much faster than conventional CPUs. Parallel computing has advantages in graphics processing, data compression, biometrics, stream processing algorithms, and the like.

In one embodiment, the PPU 700 comprises a graphics processing unit (GPU). The PPU 700 is configured to receive commands that specify shader programs for processing graphics data. Graphics data may be defined as a set of primitives such as points, lines, triangles, quads, triangle strips, and the like. Typically, a primitive includes data that specifies a number of vertices for the primitive (e.g., in a model-space coordinate system) as well as attributes associated with each vertex of the primitive. The PPU 700 can be configured to process the graphics primitives to generate a frame buffer (i.e., pixel data for each of the pixels of the display).

An application writes model data for a scene (i.e., a collection of vertices and attributes) to a memory such as a system memory or memory 704. The model data defines each of the objects that may be visible on a display. The application then makes an API call to the driver kernel that requests the model data to be rendered and displayed. The driver kernel reads the model data and writes commands to the one or more streams to perform operations to process the model data. The commands may reference different shader programs to be implemented on the SMs 840 of the PPU 700 including one or more of a vertex shader, hull shader, domain shader, geometry shader, and a pixel shader. For example, one or more of the SMs 840 may be configured to execute a vertex shader program that processes a number of vertices defined by the model data. In one embodiment, the different SMs 840 may be configured to execute different shader programs concurrently. For example, a first subset of SMs 840 may be configured to execute a vertex shader program while a second subset of SMs 840 may be configured to execute a pixel shader program. The first subset of SMs 840 processes vertex data to produce processed vertex data and writes the processed vertex data to the L2 cache 860 and/or the memory 704. After the processed vertex data is rasterized (i.e., transformed from three-dimensional data into two-dimensional data in screen space) to produce fragment data, the second subset of SMs 840 executes a pixel shader to produce processed fragment data, which is then blended with other processed fragment data and written to the frame buffer in memory 704. The vertex shader program and pixel shader program may execute concurrently, processing different data from the same scene in a pipelined fashion until all of the model data for the scene has been rendered to the frame buffer. Then, the contents of the frame buffer are transmitted to a display controller for display on a display device.

The PPU 700 may be included in a desktop computer, a laptop computer, a tablet computer, a smart-phone (e.g., a wireless, hand-held device), personal digital assistant (PDA), digital camera, a hand-held electronic device, and the like. In one embodiment, the PPU 700 is embodied on a single semiconductor substrate. In another embodiment, the PPU 700 is included in a system-on-a-chip (SoC) along with one or more other logic units such as a reduced instruction set computer (RISC) CPU, a memory management unit (MMU), a digital-to-analog converter (DAC), and the like.

In one embodiment, the PPU 700 may be included on a graphics card that includes one or more memory devices 704 such as GDDR5 SDRAM. The graphics card may be configured to interface with a PCIe slot on a motherboard of a desktop computer that includes, e.g., a northbridge chipset and a southbridge chipset. In yet another embodiment, the PPU 700 may be an integrated graphics processing unit (iGPU) included in the chipset (i.e., Northbridge) of the motherboard.

Figure 10A:
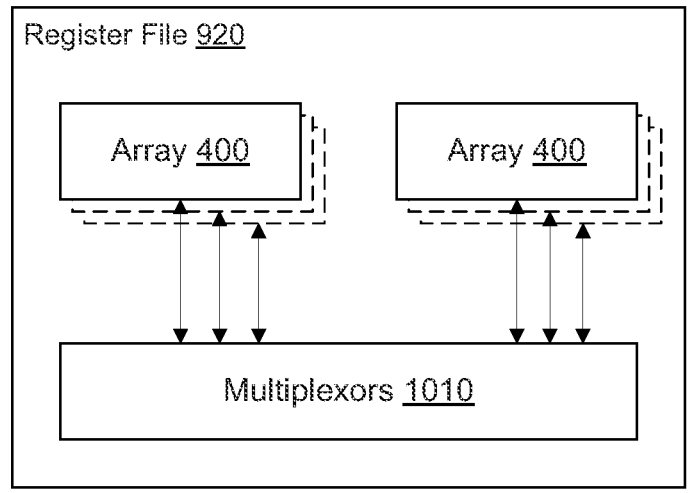
FIG. 10A illustrates the register file of the streaming multiprocessor, in accordance with one embodiment.

FIG. 10A illustrates the register file 920 of the SM 840, in accordance with one embodiment. Typically, the register file 920 is implemented using one or more banks of SRAM cells 100. However, the banks of SRAM cells 100 may be replaced with one or more arrays 400 of high-density latch cells 300. As shown in FIG. 10A, the register file 920 includes one or more arrays 400 of high-density latch cells 300 coupled to a set of multiplexors 1010. The multiplexors 1010 provide control to address different arrays 400 within the register file 920. For example, the multiplexors 1010 may be configured to route read port, write port, input, and output signals to or from a particular array 400 in order to write data to or read data from a particular row of high-density latch cells 300 in that array 400. Multiple arrays 400 may be implemented in a single register file to increase the capacity of the register file 920 given a fixed width of the read and write ports and a fixed input signal and output signal width for a row of high-density latch cells 300

In one embodiment, only a single array 400 may be accessed in the register file 920 during a particular clock cycle. In another embodiment, two or more arrays 400 may be accessed in the register file 920 during a particular clock cycle. In yet another embodiment, the multiplexors 1010 may be replaced with any control circuitry configured to select a particular array 400 or arrays 400 in the register file 920 for access operations to be performed on those arrays 400 during that particular clock cycle. Such control circuitry may be configured to write data to or read data from one or more rows in one or more arrays 400 substantially simultaneously, depending on the number of read and write ports implemented per array and whether the particular implementation of the control circuitry allows multiple arrays 400 to be accessed in a single clock cycle.

It will be appreciated that the register file 920 of FIG. 10A has replaced all of the SRAM cells 100 with arrays 400 of high-density latch cells 300. While energy savings may be realized by replacing all of the SRAM cells 100 with high-density latch cells 300, such energy savings may come at the cost of some memory capacity due to the larger size of the high-density latch cells 300. In order to alleviate issues that may arise due to decreased memory capacity, the register file 920 may be implemented using a combination of SRAM cells 100 and high-density latch cells 300. In addition, it will be appreciated that each of the arrays 400 of high-density latch cells 300 may be implemented with one or more write ports and one or more read ports.

Figure 10B:
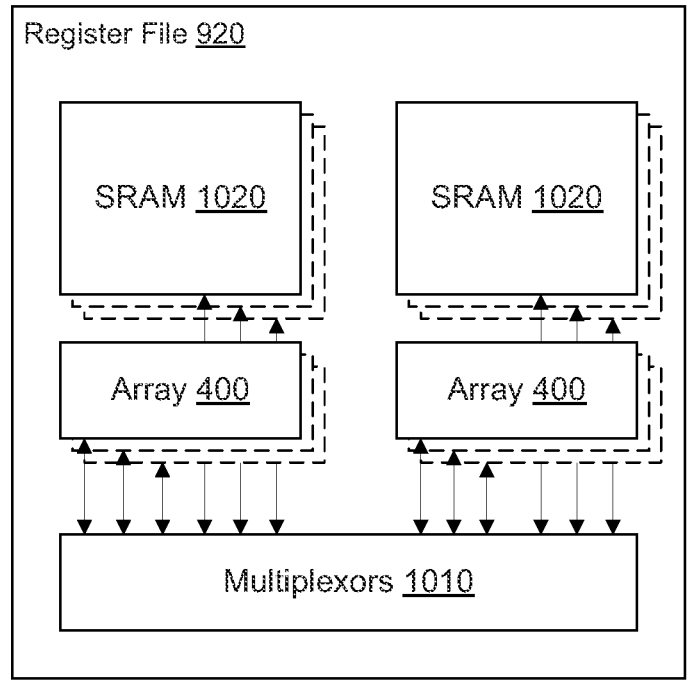
FIG. 10B illustrates the register file of the streaming multiprocessor, in accordance with another embodiment.

FIG. 10B illustrates the register file 920 of the SM 840, in accordance with another embodiment. As shown in FIG. 10B, the register file 920 may be implemented as a hybrid register file that includes one or more banks 1020 of SRAM cells 100 as well as one or more arrays 400 of high-density latch arrays 300. One benefit to the hybrid register file is that a compiler can be configured to analyze programs and allocate space in the arrays 400 to store data that is accessed frequently in order to minimize energy consumption. However, the capacity of the register file 920 is not completely sacrificed by keeping at least some of the SRAM cells 100 for storing data that is accessed less frequently.

Figure 11:
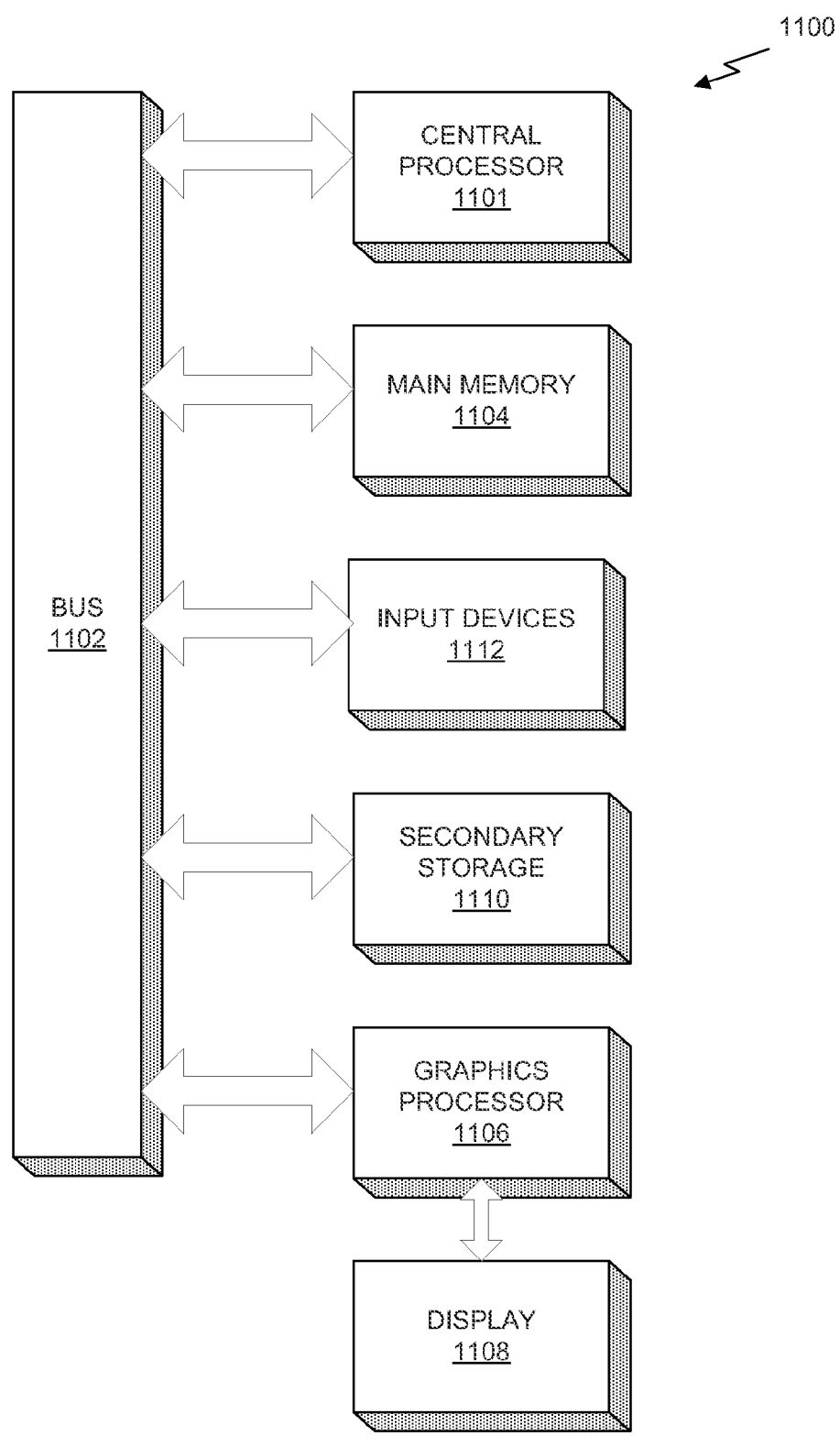
FIG. 11 illustrates an exemplary system in which the various architecture and/or functionality of the various previous embodiments may be implemented.

It will be appreciated that FIGS. 10A and 10B implement a register file of the PPU 700 using arrays 400 of high-density latch cells 300. However, any processor having a register file may implement that register file using arrays 400 of high-density latch cells 300 and the scope of the present disclosure is not limited to only the PPU 700. Other types of processors that can implement a register file in such a manner include a central processing unit (CPU) such as Intel® Core processors or a system-on-chip (SoC) that includes an ARM® CPU core and one or more co-processors such as a GPU core. FIG. 11 describes a system in which one or more components may implement a register file within the component using arrays 400 of high-density latch cells 300.

FIG. 11 illustrates an exemplary system 1100 in which the various architecture and/or functionality of the various previous embodiments may be implemented. As shown, a system 1100 is provided including at least one central processor 1101 that is connected to a communication bus 1102. The communication bus 1102 may be implemented using any suitable protocol, such as PCI (Peripheral Component Interconnect), PCI-Express, AGP (Accelerated Graphics Port), HyperTransport, or any other bus or point-to-point communication protocol(s). The system 1100 also includes a main memory 1104. Control logic (software) and data are stored in the main memory 1104 which may take the form of random access memory (RAM).

The system 1100 also includes input devices 1112, a graphics processor 1106, and a display 1108, i.e. a conventional CRT (cathode ray tube), LCD (liquid crystal display), LED (light emitting diode), plasma display or the like. User input may be received from the input devices 1112, e.g., keyboard, mouse, touchpad, microphone, and the like. In one embodiment, the graphics processor 1106 may include a plurality of shader modules, a rasterization module, etc. Each of the foregoing modules may even be situated on a single semiconductor platform to form a graphics processing unit (GPU).

In the present description, a single semiconductor platform may refer to a sole unitary semiconductor-based integrated circuit or chip. It should be noted that the term single semiconductor platform may also refer to multi-chip modules with increased connectivity which simulate on-chip operation, and make substantial improvements over utilizing a conventional central processing unit (CPU) and bus implementation. Of course, the various modules may also be situated separately or in various combinations of semiconductor platforms per the desires of the user.

The system 1100 may also include a secondary storage 1110. The secondary storage 1110 includes, for example, a hard disk drive and/or a removable storage drive, representing a floppy disk drive, a magnetic tape drive, a compact disk drive, digital versatile disk (DVD) drive, recording device, universal serial bus (USB) flash memory. The removable storage drive reads from and/or writes to a removable storage unit in a well-known manner.

Computer programs, or computer control logic algorithms, may be stored in the main memory 1104 and/or the secondary storage 1110. Such computer programs, when executed, enable the system 1100 to perform various functions. The memory 1104, the storage 1110, and/or any other storage are possible examples of computer-readable media.

In one embodiment, the architecture and/or functionality of the various previous figures may be implemented in the context of the central processor 1101, the graphics processor 1106, an integrated circuit (not shown) that is capable of at least a portion of the capabilities of both the central processor 1101 and the graphics processor 1106, a chipset (i.e., a group of integrated circuits designed to work and sold as a unit for performing related functions, etc.), and/or any other integrated circuit for that matter.

Still yet, the architecture and/or functionality of the various previous figures may be implemented in the context of a general computer system, a circuit board system, a game console system dedicated for entertainment purposes, an application-specific system, and/or any other desired system. For example, the system 1100 may take the form of a desktop computer, laptop computer, server, workstation, game consoles, embedded system, and/or any other type of logic. Still yet, the system 1100 may take the form of various other devices including, but not limited to a personal digital assistant (PDA) device, a mobile phone device, a television, etc.

Further, while not shown, the system 1100 may be coupled to a network (e.g., a telecommunications network, local area network (LAN), wireless network, wide area network (WAN) such as the Internet, peer-to-peer network, cable network, or the like) for communication purposes.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A device comprising:
   an array of cells arranged into columns and rows, wherein each cell comprises a latch cell that includes a transmission gate, a pair of inverters, and an output buffer,
   wherein each row of latch cells is connected to at least one common node for addressing the row of latch cells, and
   wherein each column of latch cells is connected to a particular bit of an input signal and a particular bit of an output signal,
   wherein the pair of inverters comprises an inverter having an input coupled to an output of a tri-state inverter, and wherein an input of the tri-state inverter is coupled to an output of the inverter.

2. The device of claim 1, wherein the transmission gate comprises a PMOS transistor and an NMOS transistor, and wherein a source terminal of the PMOS transistor is connected to a source terminal of the NMOS transistor and a drain terminal of the PMOS transistor is connected to a drain terminal of the NMOS transistor, and wherein a gate terminal of the PMOS transistor is connected to a particular bit of a complementary version of a write port signal and a gate terminal of the NMOS transistor is connected to a corresponding bit of the write port signal.

3. The device of claim 1, wherein the inverter comprises a PMOS transistor and an NMOS transistor, and wherein a source terminal of the PMOS transistor is connected to a high supply voltage, a drain terminal of the PMOS transistor is connected to an output of the inverter, a source terminal of the NMOS transistor is connected to a low supply voltage, a drain terminal of the NMOS transistor is connected to the output of the inverter, and a gate terminal of the PMOS transistor and a gate terminal of the NMOS transistor are connected to an input of the inverter.

4. The device of claim 1, wherein the tri-state inverter comprises a first PMOS transistor, a second PMOS transistor, a first NMOS transistor, and a second NMOS transistor, and wherein a source terminal of the first PMOS transistor is connected to a high supply voltage, a drain terminal of the first PMOS transistor is connected to a source terminal of the second PMOS transistor, a drain terminal of the second PMOS transistor is connected to an output of the tri-state inverter, a source terminal of the first NMOS transistor is connected to a low supply voltage, a drain terminal of the first NMOS transistor is connected to a source terminal of the second NMOS transistor, a drain terminal of the second NMOS transistor is connected to the output of the tri-state inverter, a gate terminal of the first PMOS transistor is connected to a particular bit of a write port signal, a gate terminal of the second PMOS transistor is connected to an input of the tri-state inverter, a gate terminal of the first NMOS transistor is connected to a corresponding bit of a complementary version of the write port signal, and a gate terminal of the second NMOS transistor is connected to the input of the tri-state inverter.

5. The device of claim 1, wherein the output buffer comprises a tri-state inverter that includes a first PMOS transistor, a second PMOS transistor, a first NMOS transistor, and a second NMOS transistor, and wherein a source terminal of the first PMOS transistor is connected to a high supply voltage, a drain terminal of the first PMOS transistor is connected to a source terminal of the second PMOS transistor, a drain terminal of the second PMOS transistor is connected to an output of the tri-state inverter, a source terminal of the first NMOS transistor is connected to a low supply voltage, a drain terminal of the first NMOS transistor is connected to a source terminal of the second NMOS transistor, a drain terminal of the second NMOS transistor is connected to the output of the tri-state inverter, a gate terminal of the first PMOS transistor is connected to a particular bit of a complementary version of a read port signal, a gate terminal of the second PMOS transistor is connected to an input of the tri-state inverter, a gate terminal of the first NMOS transistor is connected to a corresponding bit of the read port signal, and a gate terminal of the second NMOS transistor is connected to the input of the tri-state inverter.

6. The device of claim 1, wherein each row of latch cells is connected to four common nodes for addressing the row of latch cells, each node in the four common nodes being connected to one of a particular bit of a write port signal, a corresponding bit of a complementary version of the write port signal, a particular bit of a read port signal, and a corresponding bit of a complementary version of the read port signal.

7. The device of claim 1, wherein the array of cells is implemented on an integrated circuit comprising a p-type substrate, and wherein each cell in the array of cells includes a single latch cell implemented as a plurality of transistors in a particular portion of the p-type substrate, and wherein the particular portion of the p-type substrate includes a single n-well region that implements a number of PMOS transistors in the transmission gate, the pair of inverters, and the output buffer for the single latch cell.

8. The device of claim 1, wherein the array of cells is implemented on an integrated circuit comprising a p-type substrate, and wherein each cell in the array of cells includes a pair of latch cells implemented as a plurality of transistors in a particular portion of the p-type substrate, and wherein the particular portion of the p-type substrate includes two n-well regions, wherein a first n-well region in the two n-well regions implements a number of PMOS transistors in the transmission gate and the pair of inverters for the pair of latch cells, and a second n-well region in the two n-well regions implements a number of PMOS transistors in the output buffers for the pair of latch cells.

9. The device of claim 8, wherein the plurality of transistors are FinFETs.

10. The device of claim 1, wherein each column of latch cells is sub-divided into a plurality of sub-blocks, each sub-block containing a subset of the latch cells in the column, and wherein each latch cell in the sub-block has an output coupled to a common node that is connected to the input of a tri-state inverter, the tri-state inverter having an output connected to a global output signal for the column that is coupled to an input of a driver for the column.

11. The device of claim 10, wherein the output of each latch cell in the sub-block is coupled to a second common node that is connected to the input of a second tri-state inverter, the second tri-state inverter having an output connected to a second global output signal for the column.

12. A system comprising:
a register file including at least one array of cells arranged into columns and rows, wherein each cell comprises a latch cell that includes a transmission gate, a pair of inverters, and an output buffer,
wherein each row of latch cells is connected to at least one common node for addressing the row of latch cells, and
wherein each column of latch cells is connected to a particular bit of an input signal and a particular bit of an output signal,
wherein the pair of inverters comprises an inverter having an input coupled to an output of a tri-state inverter, and wherein an input of the tri-state inverter is coupled to an output of the inverter.

13. The system of claim 12, wherein the register file includes two or more arrays of cells, the register file further comprising control circuitry for selecting a particular array in the two or more arrays of cells.

14. The system of claim 13, wherein the control circuitry comprises one or more multiplexors.

15. The system of claim 12, wherein the system comprises a parallel processing unit including a plurality of streaming multiprocessors, each streamlining multiprocessor in the plurality of streaming multiprocessors comprising a different register file including at least one array of cells.

16. The system of claim 15, wherein the parallel processing unit comprises a graphics processing unit, the system further comprising a host processor coupled to the graphics processing unit.

17. The system of claim 12, wherein the transmission gate comprises a PMOS transistor and an NMOS transistor, and wherein a source terminal of the PMOS transistor is connected to a source terminal of the NMOS transistor and a drain terminal of the PMOS transistor is connected to a drain terminal of the NMOS transistor, and wherein a gate terminal of the PMOS transistor is connected to a particular bit of a complementary version of a write port signal and a gate terminal of the NMOS transistor is connected to a corresponding bit of the write port signal.

18. The system of claim 12, wherein the output buffer comprises a tri-state inverter that includes a first PMOS transistor, a second PMOS transistor, a first NMOS transistor, and a second NMOS transistor, and wherein a source terminal of the first PMOS transistor is connected to a high supply voltage, a drain terminal of the first PMOS transistor is connected to a source terminal of the second PMOS transistor, a drain terminal of the second PMOS transistor is connected to an output of the tri-state inverter, a source terminal of the first NMOS transistor is connected to a low supply voltage, a drain terminal of the first NMOS transistor is connected to a source terminal of the second NMOS transistor, a drain terminal of the second NMOS transistor is connected to the output of the tri-state inverter, a gate terminal of the first PMOS transistor is connected to a particular bit of a complementary version of a read port signal, a gate terminal of the second PMOS transistor is connected to an input of the tri-state inverter, a gate terminal of the first NMOS transistor is connected to a corresponding bit of the read port signal, and a gate terminal of the second NMOS transistor is connected to the input of the tri-state inverter.

* * * * *